United States Patent
Suwa

(10) Patent No.: US 7,476,476 B2
(45) Date of Patent: Jan. 13, 2009

(54) PHOTOSENSITIVE RESIN COMPOSITION, ELECTRONIC COMPONENT USING THE SAME, AND DISPLAY UNIT USING THE SAME

(75) Inventor: Mitsuhito Suwa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 330 days.

(21) Appl. No.: 10/558,873

(22) PCT Filed: May 27, 2004

(86) PCT No.: PCT/JP2004/007648

§ 371 (c)(1),
(2), (4) Date: Dec. 2, 2005

(87) PCT Pub. No.: WO2004/109403

PCT Pub. Date: Dec. 16, 2004

(65) Prior Publication Data

US 2006/0159839 A1    Jul. 20, 2006

(30) Foreign Application Priority Data

Jun. 2, 2003    (JP)    ............................. 2003-156269

(51) Int. Cl.
G03F 7/037 (2006.01)
H05B 33/10 (2006.01)
H05B 33/12 (2006.01)
H05B 33/14 (2006.01)
C08L 79/08 (2006.01)
C08G 73/10 (2006.01)

(52) U.S. Cl. .................. 430/18; 430/325; 430/330; 430/311; 430/909; 430/906; 430/288.1; 430/285.1; 430/283.1; 430/14; 430/281.1

(58) Field of Classification Search ............... None
See application file for complete search history.

(56) References Cited

U.S. PATENT DOCUMENTS

| 4,297,435 A | * | 10/1981 | Jolly et al. | ............ 430/270.1 |
| 4,820,779 A | * | 4/1989 | Schoenberg | ............ 525/533 |
| 5,147,943 A | * | 9/1992 | Inoue et al. | ............ 525/423 |
| 5,204,399 A | * | 4/1993 | Edelman | ............ 524/404 |
| 6,294,259 B1 | * | 9/2001 | Anderson et al. | ............ 428/413 |

| 2004/0048978 A1 | * | 3/2004 | Okada et al. | ............ 524/606 |
| 2004/0053156 A1 | * | 3/2004 | Fujita et al. | ............ 430/191 |
| 2004/0265731 A1 | * | 12/2004 | Okada et al. | ............ 430/270.1 |

FOREIGN PATENT DOCUMENTS

| EP | 309190 A2 | * | 3/1989 |
| EP | 0-421-195 A2 | | 4/1991 |
| EP | 1-199-604 A1 | | 4/2002 |
| EP | 1209523 A2 | * | 5/2002 |
| JP | 54-109828 | | 8/1979 |
| JP | 04-27161 A | * | 1/1992 |
| JP | 10-316751 A | | 12/1998 |
| JP | 11-024268 A | | 1/1999 |
| JP | 11-282155 A | | 10/1999 |
| JP | 2001-174996 A | | 6/2001 |
| JP | 2002-003715 A | | 1/2002 |
| JP | 2002-116715 A | | 4/2002 |
| JP | 2002-182378 A | | 6/2002 |
| JP | 2002-328472 A | | 11/2002 |
| JP | 2003-021898 A | | 1/2003 |
| JP | 2003-043684 A | | 2/2003 |
| JP | 2003-077652 A | | 3/2003 |
| JP | 2004-043547 A | | 2/2004 |
| JP | 2004-133435 A | | 4/2004 |
| WO | WO 02/32966 A1 | | 4/2002 |
| WO | WO 03/038526 A1 | | 5/2003 |

OTHER PUBLICATIONS

English translation of JP, 10-316751, A (1998) from machine translation from AIPN Japan Patent Office Natinal center for Industrial Property Information and Training, generated Mar. 17, 2008, 21 pages.*

Ueda et al, Macromolecules, vol. 29, year1996 (no month), pp. 6427-6431.*

English translation of JP, 2002-003715, A (2002) from machine translation from AIPN Japan Patent Office National center for Industrial Property Information and Training, generated Mar. 17, 2008, 24 pages.*

* cited by examiner

*Primary Examiner*—Cynthia Hamilton
(74) *Attorney, Agent, or Firm*—Morrison & Foerster LLP

(57) ABSTRACT

This invention relates to a negative-working photosensitive resin composition that can be developed in an alkaline developer. This photosensitive resin composition comprises: (a) a polyimide having at least one group selected from the group consisting of a carboxyl group, a phenolic hydroxyl group, a sulfonic acid group, and a thiol group at the terminus of the polymer main chain; (b) a compound having a polymerizable functional group comprising unsaturated double and/or triple bonds; and (c) a photopolymerization initiator.

8 Claims, No Drawings

PHOTOSENSITIVE RESIN COMPOSITION, ELECTRONIC COMPONENT USING THE SAME, AND DISPLAY UNIT USING THE SAME

REFERENCE TO RELATED APPLICATION

This application is a national stage of PCT/JP204-007648, which was filed on May 27, 2004 and which claims the benefit of priority to Japanese Application No. 2003-156269 filed Jun. 2, 2003.

1. Technical Field

The present invention relates to a heat resistant resin composition that is suitable for a surface protective film of a semiconductor device, an interlayer insulation film of a semiconductor device, an insulation film of an organic electroluminescent element, and an insulation film for protecting wirings of a circuit board. More particularly, the present invention relates to a negative-working photosensitive resin composition, regarding which a portion that has not been exposed to ultraviolet light is easily soluble in an aqueous alkaline solution and a portion that has been exposed to such ultraviolet light is insoluble in such solution, an electronic component using the same, and a display unit using the same.

2. Background Art

In the semiconductor industry, inorganic materials have been heretofore used as interlayer insulation films. In recent years, resin compositions having excellent heat resistance, such as polyimide or polybenzoxazole, have been used as interlayer insulation films because of their properties. However, the formation of patterns on the semiconductor integrated circuits or the printed circuit board involves complicated and extensive processes, such as formation of a film of a resist material on the surface of the substrate, exposure of a given site, removal of unnecessary sites via etching or the like, and washing of the surface of the substrate. Accordingly, a heat resistant photosensitive material was developed, via which a resist material at a portion that is necessary after pattern formation via exposure and developing can be maintained and used as an insulation material.

Heat resistant photosensitive materials, such as photosensitive polyimide and photosensitive polybenzoxazole, have been developed and put to practical use. Negative-working photosensitive polyimide materials that employ organic solvents in developing have excellent heat resistance, and impurities can be easily removed therefrom. Accordingly, such negative-working photosensitive polyimide materials are employed by a large number of device manufacturers. Such negative-working photosensitive polyimide materials, which are produced by a method (JP Patent Publication (Unexamined) Nos. 54-109828 (1979) and 11-24268 (1999)), wherein a compound having a photosensitive group is added to or mixed with a polyimide precursor, develop contrast via crosslinking and the like to form patterns. These negative-working photosensitive polyimide materials are basically designed to be suitable for developing that employs organic solvents. However, these materials are not intended to cope with developing that employs an aqueous alkaline solution (i.e., an aqueous solution of tetramethylammonium hydroxide), which is considered to be less problematic in terms of waste liquid processing in view of the environmental consciousness of recent years, and they have poor solubility. Thus, it was difficult for them to form patterns. Further, negative-working photosensitive polyimide materials that can employ an alkaline solution in developing must comprise an alkali-soluble group as base material. In contrast, it was difficult to efficiently reproduce patterns following efficient developing with the use of a negative-working and alkaline-developable photosensitive polyimide precursor, which is prepared by a method wherein a photoreactive group is introduced into some of the alkali-soluble groups of the polyimide precursor (EP 0421195, JP Patent Publication (Unexamined) No. 2002-182378), because of deteriorated polymer solubility in an alkaline developer caused by the introduction of a photoreactive group. Even if patterns were effectively reproduced following developing, film is significantly cured and shrunk upon the ring closure reaction that occurs when a polyimide precursor is finally converted into a polyimide. When a thick film of 20 μm or more was used, the film became cracked and thus was difficult to use. Although a polyimide that was soluble in an organic solvent and in alkali was developed, it was difficult to efficiently reproduce good patterns following developing when a photoreactive group was introduced into some of the alkali-soluble groups of the polymer. Thus, a photo acid generator or a photo acid generator and an acid crosslinking agent are added to the composition instead of introducing a photoreactive group to the polymer to prepare a positive-working or negative-working material (EP 1199604 and JP Patent Publication (No.) 10-316751 (1998)).

DISCLOSURE OF THE INVENTION

The present invention provides a negative-working photosensitive resin composition, regarding which a portion that has not been exposed to ultraviolet light is easily soluble in an aqueous alkaline solution and a portion that has been exposed to such ultraviolet light is insoluble in such solution, using an alkali-soluble and organic solvent-soluble polyimide having a specific structure. The present invention also provides a composition that renders the aforementioned polyimide easily soluble in an alkaline developer before exposure and insoluble therein after exposure, thereby effectively reproducing fine patterns.

More specifically, the present invention relates to a photosensitive resin composition comprising: (a) a polyimide having at least one group selected from the group consisting of a carboxyl group, a phenolic hydroxyl group, a sulfonic acid group, and a thiol group at the terminus of the polymer main chain; (b) a compound having a polymerizable functional group comprising unsaturated double and/or triple bonds; and (c) a photopolymerization initiator.

The present invention can provide a polyimide having an alkali-soluble group at its polymer terminus and being soluble in an alkaline solution as well as in an organic solvent via adequate regulation of polymer molecular weight. Use thereof as a base polymer can eliminate the need for imide conversion of a polymer via high-temperature-treatment after developing with an aqueous alkaline solution. Also, a negative-working photosensitive resin composition can be obtained, which is excellent in pattern formation, heat shrinkability, crack resistance, stress resistance, and practicability in heat treatment. The resulting composition is particularly preferably used for a surface protective film of a semiconductor device, an interlayer insulation film of a semiconductor device, an insulation film of a display unit, and an insulation film for protecting wirings of a circuit board.

This description includes part or all of the contents as disclosed in the description and/or drawings of Japanese Patent Application No. 2003-156269, which is a priority document of the present application.

PREFERRED EMBODIMENT OF THE INVENTION

In terms of usefulness, the polyimide used in the present invention is soluble not only in an organic solvent but also in an alkaline solution because it has an alkali-soluble group at the terminus of its polymer main chain. Because of the polyimide structure, it is not necessary to prepare an imide ring via a ring closure reaction via heating or with the aid of an adequate catalyst, unlike the case of a polyimide precursor. Accordingly, high temperature treatment is unnecessary, stress resulting from curing and shrinkage via imide ring closure is small, and thus, a thick film can be formed more easily than with the use of a polyimide precursor. In view of practicability concerning an alkaline developer used in the semiconductor industry, an alkali-soluble group used in the polyimide of the present invention is preferably a hydroxyl group (particularly a phenolic hydroxyl group), a thiol group, or a carboxyl group. A phenolic hydroxyl group and a thiol group are particularly preferable.

In the present invention, a resin composition is obtained by adding a compound having a polymerizable functional group comprising unsaturated double and/or triple bonds and a photopolymerization initiator to a polyimide synthesized with the use of an endcap agent having an alkali-soluble group. This composition is easily soluble in an alkaline developer before exposure but becomes hardly soluble therein after exposure. Thus, a reduction in film thickness caused by developing is small, and imide conversion of a polymer via high-heat treatment following developing with an aqueous alkaline solution is not necessary. Thus, the composition of the present invention is excellent in pattern formation, heat shrinkability, crack resistance, stress resistance, and practicability in heat treatment (low-temperature treatment).

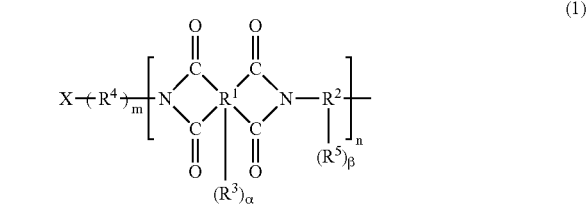

(1)

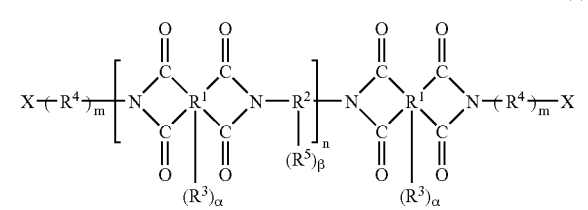

(2)

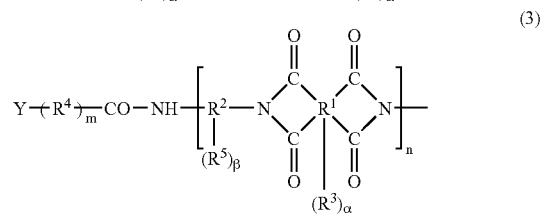

(3)

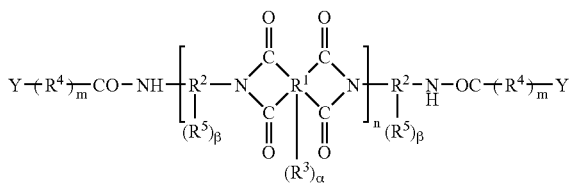

(4)

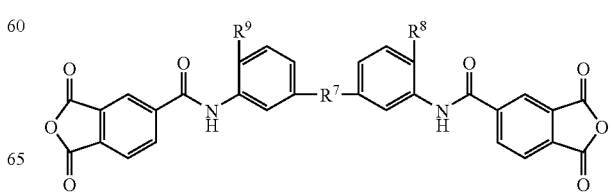

In these formulae, $R^1$ represents a 4- to 14-valent organic group; $R^2$ represents a 2- to 12-valent organic group; $R^3$ and $R^5$ each represent a hydrogen atom or an organic group having at least one member selected from the group consisting of a phenolic hydroxyl group, a sulfonic acid group, a thiol group, and organic groups having 1 to 20 carbon atoms, which may be the same or different; $R^4$ represents a 2-valent organic group; X and Y each represent a 2-valent to 8-valent organic group having at least one member selected from the group consisting of a carboxyl group, a phenolic hydroxyl group, a sulfonic acid group, and a thiol group; n is a number between 3 and 200; and m, $\alpha$, and $\beta$ are each an integer between 0 and 10.

In formulae (1) to (4), $R^1$ represents structural elements of acid dianhydrides, which are 4- to 14-valent organic groups comprising aromatic or aliphatic rings. Organic groups having 5 to 40 carbon atoms are particularly preferable.

Specific examples of acid dianhydrides include: aromatic tetracarboxylic acid dianhydrides, such as pyromellitic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,5,6-naphthalenetetracarboxylic acid dianhydride, 9,9-bis(3,4-dicarboxyphenyl)fluorene acid dianhydride, 9,9-bis{4-(3,4-dicarboxyphenoxy)phenyl}fluorene acid dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, and 2,2-bis(3,4-dicarboxyphenyl)hexafluoropropane dianhydride; aliphatic tetracarboxylic acid dianhydrides, such as butanetetracarboxylic acid dianhydride and 1,2,3,4-cyclopentanetetracarboxylic acid dianhydride; 3,3',4,4'-diphenylsulfonetetracarboxylic acid dianhydride; and an acid dianhydride having the structure shown below.

-continued

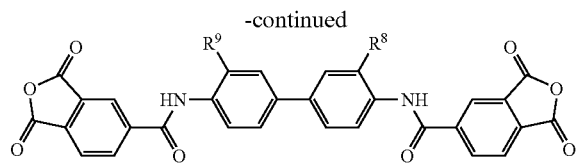

In the formula, $R^7$ represents an oxygen atom or a group selected from the group consisting of $C(CF_3)_2$, $C(CH_3)_2$, and $SO_2$; and $R^8$ and $R^9$ may be the same or different and each represent a group selected from the group consisting of a hydrogen atom, a hydroxyl group, and a thiol group.

Among these compounds, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 2,2-bis(3,4-dicarboxyphenyl)hexafluoropropane dianhydride, 3,3',4,4'-diphenylsulfonetetracarboxylic acid dianhydride, 9,9-bis(3,4-dicarboxyphenyl)fluorene acid dianhydride, 9,9-bis{4-(3,4-dicarboxyphenoxy)phenyl}fluorene acid dianhydride, and an acid dianhydride having the structure shown below are preferable. These compounds may be used alone or in combinations of two or more.

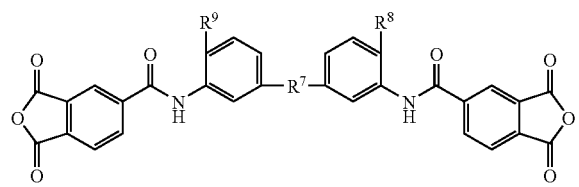

In the formula, $R^7$ represents an oxygen atom or a group selected from the group consisting of $C(CF_3)_2$, $C(CH_3)_2$, and $SO_2$; and $R^8$ and $R^9$ may be the same or different and each represent a group selected from the group consisting of a hydrogen atom, a hydroxyl group, and a thiol group.

In formulae (1) to (4), $R^2$ represents structural elements of diamine, which are 2-valent to 12-valent organic groups comprising aromatic or aliphatic rings. Organic groups having 5 to 40 carbon atoms are particularly preferable.

Specific examples of diamine include 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy)benzene, benzine, m-phenylenediamine, P-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, compounds obtained by substituting one or more hydrogens of aromatic rings of these substances with alkyl groups or halogen atoms; aliphatic cyclohexyldiamine, methylene biscyclohexylamine, and diamine having the structure shown below:

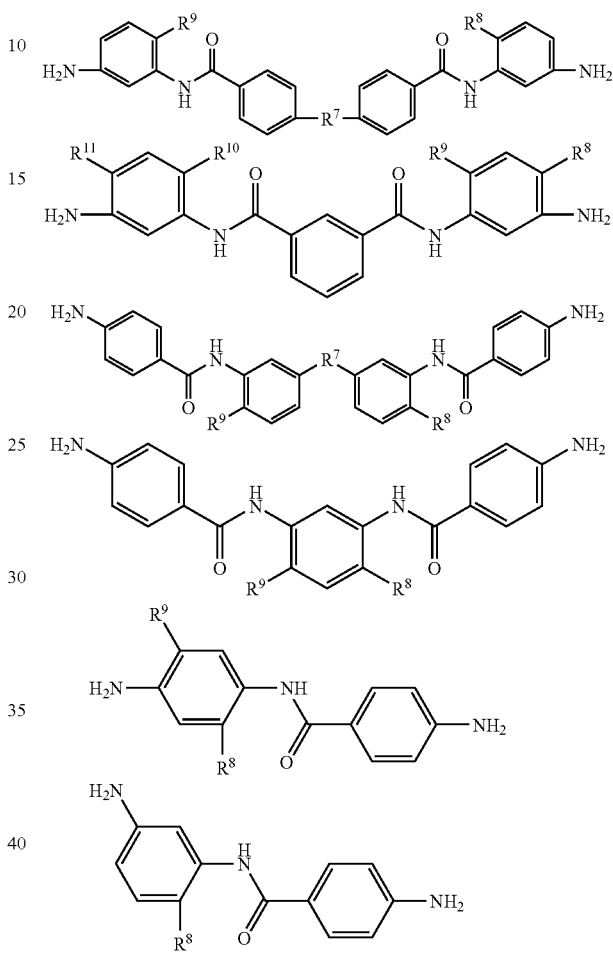

wherein $R^7$ represents an oxygen atom or a group selected from the group consisting of $C(CF_3)_2$, $C(CH_3)_2$, and $SO_2$; and $R^8$ to $R^{11}$ may be the same or different and each represent a group selected from the group consisting of a hydrogen atom, a hydroxyl group, and a thiol group.

Among these compounds, 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenyl sulfide, 4,4'-diaminodiphenyl sulfide, m-phenylenediamine, P-phenylenediamine, 1,4-bis(4-aminophenoxy)benzene, 9,9-bis(4-aminophenyl)fluorene, and diamine having the structure shown below are preferable:

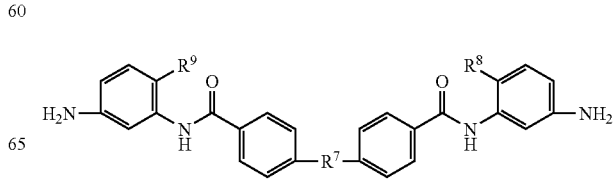

-continued

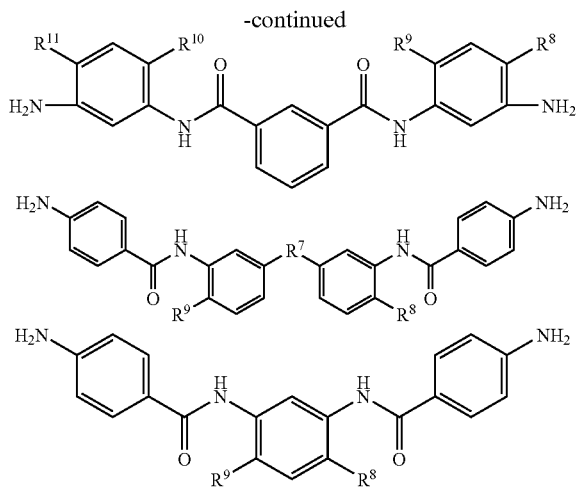

wherein R⁷ represents an oxygen atom or a group selected from the group consisting of C(CF₃)₂, C(CH₃)₂, and SO₂; and R⁸ to R¹¹ may be the same or different and each represent a group selected from the group consisting of a hydrogen atom, a hydroxyl group, and a thiol group. 3,4'-Diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 1,4-bis(4-aminophenoxy)benzene, and diamine having the structure shown below are particularly preferable. These compounds may be used alone or in combinations of two or more.

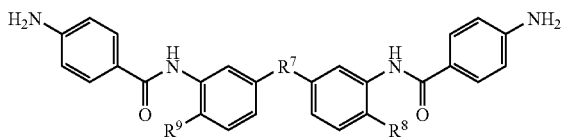

In the formula, $R^7$ represents an oxygen atom or a group selected from the group consisting of $C(CF_3)_2$, $C(CH_3)_2$, and $SO_2$; and $R^8$ and $R^9$ may be the same or different and each represent a group selected from the group consisting of a hydrogen atom, a hydroxyl group, and a thiol group.

In formulae (1) to (4), $R^3$ and $R^5$ each represent a hydrogen atom, a phenolic hydroxyl group, a sulfonic acid group, a thiol group, or an organic group having 1 to 20 carbon atoms. From the viewpoint of stability of the resulting solution of photosensitive resin composition, $R^3$ and $R^5$ each preferably represent a hydrogen atom or an organic group. From the viewpoint of solubility in an aqueous alkaline solution, an alkali-soluble group, i.e., a phenolic hydroxyl group, a sulfonic acid group, or a thiol group, is preferable.

In the present invention, a phenolic hydroxyl group, a sulfonic acid group, or a thiol group and a hydrogen atom or an alkyl group may exist simultaneously.

By regulating the amounts of an alkali-soluble group, hydrogen, or an organic group represented by $R^3$ and $R^5$, the rate of dissolution in an aqueous alkaline solution can be altered. Thus, a negative-working photosensitive resin composition having a more adequate rate of dissolution can be obtained. Preferably, the abundance of an alkali-soluble group in $R^3$ and in $R^5$ is 5% to 100% thereof. When an organic group represented by $R^3$ or $R^5$ has more than 20 carbon atoms, the composition becomes insoluble in an aqueous alkaline solution. Accordingly, $R^3$ and $R^5$ each preferably comprise a hydrogen atom or at least one hydrocarbon group having 1 to 16 carbon atoms and the balance is an alkali-soluble group.

NH—(R⁴)m-X, which is a constituent of formulae (1) and (2), is preferably represented by formula (6), which is a component derived from a primary monoamine as an endcap agent. X is preferably a 2-valent to 8-valent organic group having at least one member selected from the group consisting of a carboxyl group, a phenolic hydroxyl group, a sulfonic acid group, and a thiol group, and more preferably a 2-valent to 8-valent organic group having at least one member selected from the group consisting of a carboxyl group, a phenolic hydroxyl group, and a thiol group.

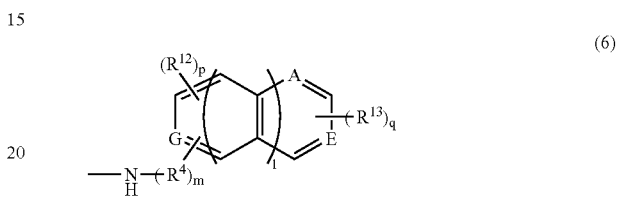

—CO—(R⁴)m-Y, which is a constituent of formulae (3) and (4), is preferably represented by formulae (7) and (8), which is a component derived from a substance selected from the group consisting of an acid anhydride, a monocarboxylic acid, a monoacid chloride compound, or a monoactivated ester compound, as an endcap agent. Y is preferably a 2-valent to 8-valent organic group having at least one member selected from the group consisting of a carboxyl group, a phenolic hydroxyl group, a sulfonic acid group, and a thiol group. More preferably, Y is a 2-valent to 8-valent organic group having at least one member selected from the group consisting of a carboxyl group, a phenolic hydroxyl group, and a thiol group. In formulae (3) and (4), Y may include only an endcap group represented by formula (7), only an endcap group represented by formula (8), or both groups represented by formulae (7) and (8).

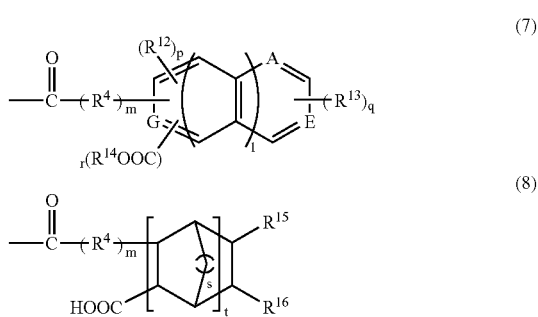

In formulae (6) to (8), $R^4$ represents a 2-valent group selected from the group consisting of —$CR^{17}R^{18}$—, —$CH_2O$—, and —$CH_2SO_2$—; and $R^{17}$ and $R^{18}$ each represent a monovalent group selected from the group consisting of a hydrogen atom, a hydroxyl group, and hydrocarbon groups having 1 to 10 carbon atoms; and $R^{14}$ represents a monovalent group selected from the group consisting of a hydrogen atom and hydrocarbon groups having 1 to 10 carbon atoms. A hydrogen atom or hydrocarbon groups having 1 to 4 carbon atoms is preferable, and a hydrogen atom, a methyl group, and a t-butyl group are particularly preferable. $R^{15}$ and $R^{16}$ each represent a monovalent group selected from the group consisting of a hydrogen atom and hydrocarbon groups having 1 to 4 carbon atoms or a ring structure wherein $R^{15}$ is directly bound to $R^{16}$ (e.g., a nadiimide ring). $R^{12}$ and $R^{13}$ are each selected from the group consisting of a hydrogen atom, a hydroxyl group, a carboxyl group, a sulfonic acid group, a thiol group, and hydrocarbon groups having 1 to 10 carbon atoms. At least one of $R^{12}$ and $R^{13}$ is a hydroxyl group, a carboxyl group, a sulfonic acid group, or a thiol group. A, E, and G are carbon atoms or nitrogen atoms, which may be the same or different. m is an integer between 0 and 10, and preferably an integer between 0 and 4. l is 0 or 1, and preferably 0. p is 0 or 1, and preferably 0. q is an integer between 1 and 3, and preferably 1 or 2. r, s, and t are each 0 or 1.

In formula (6), specific examples of the primary monoamines include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-o-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, and 4-aminothiophenol.

Among these compounds, for example, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol are particularly preferable. They may be used alone or in combinations of two or more.

In formulae (7) and (8), specific examples of the acid anhydride, the monocarboxylic acid, the monoacid chloride compound, and the monoactivated ester compound include: acid anhydrides, such as phthalic anhydride, maleic anhydride, nadic acid, cyclohexanedicarboxylic anhydride, and 3-hydroxyphthalic anhydride; monocarboxylic acids, such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, and monoacid chloride compounds of these substances in which carboxylic groups thereof are chloridized; monoacid chloride compounds obtained by chloridizing monocarboxyl groups of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; and activated ester compounds obtained by the reaction between a monoacid chloride compound and N-hydroxybenzotriazole or N-hydroxy-5-norbornene-2,3-dicarboxyimide.

Among these compounds, particularly preferred examples are: acid anhydrides, such as phthalic anhydride, maleic anhydride, nadic acid, cyclohexanedicarboxylic anhydride, and 3-hydroxyphthalic anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, and monoacid chloride compounds of these substances in which carboxylic groups thereof are chloridized; monoacid chloride compounds obtained by chloridizing monocarboxyl groups of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene; and activated ester compounds obtained by the reaction between a monoacid chloride compound and N-hydroxybenzotriazole or N-hydroxy-5-norbornene-2,3-dicarboxyimide. They may be used alone or in combinations of two or more.

The amount of the introduced component represented by formula (6), i.e., the component X in formulae (1) and (2), is preferably in the range of 0.1 to 60 molar percent, and more preferably 5 to 50 molar percent, relative to the entire amine component when calculated based on the primary monoamine component, which is the original component functioning as the endcap agent.

The amount of the introduced component represented by formulae (7) and (8), i.e., the component Y in formulae (3) and (4), is preferably in the range of 0.1 to 60 molar percent, and more preferably 5 to 55 molar percent, relative to the diamine component when calculated based on the acid anhydride, the monocarboxylic acid, the monoacid chloride compound, or the monoactivated ester compound, which is the original component functioning as the endcap agent.

In formulae (1) to (4), n represents the number of recurring structure units of the polymer of the present invention, and n is preferably in the range of 3 to 200, and more preferably in the range of 5 to 100. When n is smaller than 3, the viscosity of the composition may not be increased, which may result in incapability of the use of the composition as a thick film. In contrast, when n is larger than 200, the composition may become insoluble in an alkaline developer.

When the structures represented by formulae (1) to (4) each contain 10% by weight or more of fluorine atoms, a suitable degree of water repellency is exhibited at the film interface during developing with an aqueous alkaline solution, thereby preventing leakage at the interface. At a content of fluorine atoms exceeding 20% by weight, however, the solubility in an aqueous alkaline solution disadvantageously decreases. Thus, a content of fluorine atoms is preferably 10% to 20% by weight.

In order to enhance the adhesion to the substrate, $R^1$ and $R^2$ may be copolymerized with an aliphatic group having a siloxane structure as long as the heat resistance is not deteriorated. Specific examples thereof are those prepared by copolymerizing 1 to 10 molar percent of bis(3-aminopropyl)tetramethyldisiloxane, bis(p-amino-phenyl)octamethylpentasiloxane, or the like, as the diamine component.

The photosensitive resin composition of the present invention may consist of the structural units represented by formulae (1) to (4), or it may be copolymerized or mixed with other structural units. In such a case, the composition preferably comprises 50 molar percent or more of the structural units represented by formulae (1) to (4). The type and the amount of the structural units to be copolymerized or mixed are adequately determined so as not to deteriorate the heat resistance of the polyimide polymer obtained by the final heat treatment.

The polyimide of the present invention is synthesized by a conventional method whereby replaces part of a diamine with a monoamine endcap agent or whereby replaces the acid dianhydride with an endcap agent such as a monocarboxylic acid, an acid anhydride, a monoacid chloride compound, or a monoactivated ester compound. Examples of conventional methods that can be employed include: a method of allowing tetracarboxylic dianhydride to react with a diamine compound (part of which is substituted by a monoamine endcap agent) at a low temperature; a method of allowing tetracarboxylic dianhydride (part of which is substituted with an endcap agent, such as an acid anhydride, a monoacid chloride compound, or a monoactivated ester compound) to react with a diamine compound at a low temperature; a method comprising obtaining diester from tetracarboxylic dianhydride and alcohol and allowing the diester to react with diamine (part of which is substituted by a monoamine endcap agent) in the presence of a condensing agent; and a method comprising obtaining diester from tetracarboxylic dianhydride and alcohol, chloridizing the remaining dicarboxylic acid, and allowing the chloridized dicarboxylic acid to react with diamine (part of which is substituted with a monoamine endcap agent). Via such methods, a polyimide precursor is obtained and then converted to the complete imide via a conventional technique of imide conversion. Alternatively, imide conversion is terminated in the middle of the reaction to introduce a partial imide structure. Further, a polymer of the complete imide is mixed with a polyimide precursor thereof to introduce a partial imide structure.

The composition of the present invention preferably comprises polyimide to such an extent that the rate of imide conversion becomes 15% or higher, and more preferably 20% or hither, based on the amount of the total polymer constituting the composition. The term "rate of imide conversion" used herein refers to the abundance of the imide compounds in the entire polymer that constitutes the composition of the present invention. When the rate of imide conversion is lower than 15%, the shrinkage at the time of heat curing becomes enlarged, which is unsuitable for the formation of a thick film.

The rate of imide conversion can be easily calculated in the following manner. At the outset, the infrared absorption spectrum of the polymer is measured, and the absorption peaks of the polyimide imide structure are detected at around 1780 $cm^{-1}$ and 1377 $cm^{-1}$. Subsequently, the polymer is subjected to heat treatment at 350° C. for 1 hour, the infrared absorption spectrum is measured after heat treatment, and the obtained peak intensity at around 1377 $cm^{-1}$ is compared with the intensity before heat treatment to determine the rate of imide conversion in the polymer before heat treatment.

The composition of the present invention preferably comprises at least one polyimide selected from resins having the structural units represented by formulae (1) to (4) as the component (a). In this case, such polyimide is preferably contained 10% by weight or more, and more preferably 20% by weight or more, based on the amount of the entire polymer that constitutes the composition of the present invention. When such polyimide is contained 10% by weight or more based thereon, the rate of imide conversion in the entire polymer constituting the composition is 15% or higher.

The endcap agent, which has been introduced into the polymer, can be readily detected in the following manner. For example, the polymer containing the endcap agent is dissolved in an acidic solution so as to be decomposed into amine components and acid anhydride components, which are the structure units of the polymer. Subsequently, gas chromatography (GC) or nuclear magnetic resonance (NMR) analysis is performed to readily detect the endcap agent used in the present invention. Alternatively, the endcap agent can be readily detected by directly performing pyrolysis gas chromatography (PGC) or infrared spectrum and C13 NMR spectrum analysis on the polymer component containing the endcap agent.

A compound having the polymerizable group (b) that is used in the present invention comprises a polymerizable unsaturated functional group. Examples of such functional group include an unsaturated functional group comprising a double bond, such as a vinyl, allyl, acryloyl, or methacryloyl group, and/or an unsaturated functional group comprising a triple bond, such as a propargyl group. Among these groups, a conjugated vinyl, acryloyl, or methacryloyl group is particularly preferable in terms of polymerizability. The number of the functional groups to be contained is preferably 1 to 4 from the viewpoint of stability, and these groups may not be of the same type. The term "compound" used herein refers to a compound having a molecular weight of 30 to 800.

Examples of compounds having polymerizable groups include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, isobornyl methacrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol methacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, 2-hydroxyethyl acrylate, 2-hydroxyethyl methacrylate, 1,3-acryloyloxy-2-hydroxypropane, 1,3-methacryloyloxy-2-hydroxypropane, methylenebisacrylamide, N,N-dimethylacrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, N-vinyl pyrrolidone, and N-vinyl caprolactam. These compounds may be used alone or in combinations of two or more.

Among these compounds, particularly preferable compounds are, for example, 1,9-nonanediol dimethacrylate, 1,10-decanediol dimethacrylate, dimethylol-tricyclodecane diacrylate, isobornyl acrylate, isobornyl methacrylate, pentaerythritol triacrylate, pentaerythritol tetraacrylate, pentaerythritol trimethacrylate, pentaerythritol tetramethacrylate, methylenebisacrylamide, N,N-dimethylacrylamide, N-methylol acrylamide, 2,2,6,6-tetramethylpiperidinyl methacrylate, 2,2,6,6-tetramethylpiperidinyl acrylate, N-methyl-2,2,6,6-tetramethylpiperidinyl methacrylate, N-methyl-2,2,6,6-tetramethylpiperidinyl acrylate, N-vinyl pyrrolidone, and N-vinyl caprolactam.

In the present invention, the amount of the compound (b) to be used is preferably 5 to 200 parts by weight based on 100 parts by weight of the polymer (a). It is more preferably 5 to 150 parts by weight from the viewpoint of compatibility. When such amount is less than 5 parts by weight, the exposed area is dissolved at the time of developing. Thus, a film may not remain after developing. When such amount exceeds 200 parts by weight, the film may not remain, either, and a film may become whitened at the time of film formation.

Examples of the photopolymerization initiators (c) used in the present invention include: benzophenones, such as benzophenone, Michler's ketone, 4,4,-bis(diethylamino)benzophenone, and 3,3,4,4,-tetra(t-butylperoxycarbonyl)-benzophenone; benzylidenes, such as 3,5-bis(diethylaminobenzylidene)-N-methyl-4-piperidone and 3,5-bis(diethylaminobenzylidene)-N-ethyl-4-piperidone; coumarins, such as 7-diethylamino-3-thenoylcoumarin, 4,6-dimethyl-3-ethylaminocoumarin, 3,3,-carbonylbis(7-diethylaminocoumarin), 7-diethylamino-3-(1-methylbenzimidazoyl)coumarin, and 3-(2-benzothiazolyl)-7-diethylaminocoumarin; anthraquinones, such as 2-t-butylanthraquinone, 2-ethylanthraquinone, and 1,2-benzanthraquinone; benzoins, such as benzoinmethyl ether, benzoinethyl ether, and benzoinisopropylether; thioxanthones, such as 2,4-dimethylthioxanthone, 2,4-diethylthioxanthone, 2,4-diisopropylthioxanthone, and 2-isopropylthioxanthone; mercaptos, such as ethylene glycol di(3-mercaptopropionate), 2-mercaptobenzothiazole, 2-mercaptobenzoxazole, and 2-mercaptobenzimidazole; glycines, such as N-phenylglycine, N-methyl-N-phenylglycine, N-ethyl-N-(p-chlorophenyl)glycine, and N-(4-cyanophenyl)glycine; oximes, such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, bis($\alpha$-isonitrosopropiophenone oxime)isophthal, and 1,2-octanedione, 1-[4-(phenylthio)phenyl]-,2-(o-benzoyl oxime); $\alpha$-aminoalkylphenones, such as 2-benzyl-2-dimethylamino-1-(4-morpholinophenyl)-butanone-1, and 2-methyl-1[4-(methylthio)phenyl]-2-morpholinopropan-1-one; and 2,2'-bis(o-chlorophenyl)-4,4',5,5'-tetraphenylbiimidazole. Among these compounds, oximes, such as 1-phenyl-1,2-butanedione-2-(o-methoxycarbonyl) oxime, 1-phenyl-1,2-propanedione-2-(o-methoxycarbonyl) oxime, 1-phenyl-1,2-propanedione-2-(o-ethoxycarbonyl) oxime, 1-phenyl-1,2-propanedione-2-(o-benzoyl)oxime, bis($\alpha$-isonitrosopropiophenone oxime)isophthal, and 1,2-octanedione, 1-[4-(phenylthio)phenyl]-,2-(o-benzoyl oxime) are preferable. 1-Phenyl-1,2-propanedione-2-(o-ethoxycarbonyl)oxime, 1-phenyl-1,2-propanedione-2-(o-benzoyl)oxime, bis($\alpha$-isonitrosopropiophenone oxime)isophthal, and 1,2-octanedione, 1-[4-(phenylthio)phenyl]-,2-(o-benzoyl oxime) are particularly preferable. These compounds may be used alone or in combinations of two or more.

Among these compounds, a combination of the compound of the present invention with the aforementioned benzophenones, glycines, mercaptos, oximes, $\alpha$-aminoalkylphenones, or 2,2'-bis(o-chlorophenyl)-4,4',5,5'-tetraphenylbiimidazole is preferable from the viewpoint of photoreaction. These photosensitizing agents may be used alone or in combinations of two or more.

When a single type of photopolymerization initiator is used, the amount of the photopolymerization initiator (c) to be used is generally 0.1 to 40 parts by weight based on 100 parts by weight of the polymer (a). When two or more types of photopolymerization initiators are combined, a total amount thereof is preferably 0.2 to 60 parts by weight.

Examples of the thermally crosslinkable compound (d) that is used in the present invention include a compound having a thermally crosslinkable group represented by formula (5) and a benzoxazine compound:

(5)

wherein $R^6$ represents a hydrogen atom, an alkyl group having 1 to 20 carbon atoms, a alicyclic group having 4 to 20 carbon atoms, or an $R^7CO$ group; and $R^7$ represents an alkyl group having 1 to 20 carbon atoms.

Examples of the thermally crosslinkable compounds include: as those having one of such a thermally crosslinkable group, ML-26×, ML-24×, ML-236TMP, 4-methylol3M6C, ML-MC, and ML-TBC (trade names, Honshu Chemical Industry Co., Ltd.), and P-a type benzoxazine (trade name, Shikoku Chemicals Corp.); as those having two of such groups, DM-BI25X-F, 46DMOC, 46DMOIPP, and 46DMOEP (trade names, Asahi Organic Chemicals Industry Co., Ltd.), DML-MBPC, DML-MBOC, DML-OCHP, DML-PC, DML-PCHP, DML-PTBP, DML-34×, DML-EP, DML-POP, DML-OC, dimethylol-Bis-C, dimethylol-Bis OC-P, DML-Bis OC-Z, DML-Bis OCHP-Z, DML-PFP, DML-PSBP, DML-MB25, DML-MTris PC, DML-Bis25X-34XL, and DML-Bis25X-PCHP (trade names, Honshu Chemical Industry Co., Ltd.), Nikalac MX-290 (trade name, Sanwa Chemical Co., Ltd.), B-a type benzoxazine and B-m type benzoxazine (trade names, Shikoku Chemicals Corp.), 2,6-dimethoxymethyl-4-t-butylphenol, 2,6-dimethoxymethyl-p-cresol, and 2,6-diacetoxymethyl-p-cresol; as those having three of such groups, TriML-P, TriML-35XL, and TriML-Tris Cr-HAP (trade names, Honshu Chemical Industry Co., Ltd.); as those having four of such groups, TM-BIP-A (trade name, Asahi Organic Chemicals Industry Co., Ltd.), TML-BP, TML-HQ, TML-pp-BPF, TML-BPA, and TMOM-BP (trade names, Honshu Chemical Industry Co., Ltd.), Nikalac MX-280 and Nikalac MX-270 (trade names, Sanwa Chemical Co., Ltd.); and as those having six of such groups, HML-TPPHBA and HML-TPHAP (trade names, Honshu Chemical Industry Co., Ltd.) and Nikalac MW-390 and Nikalac MW-100LM (trade names, Sanwa Chemical Co., Ltd.).

Among these compounds, those including at least two thermally crosslinkable groups are preferable in the present invention. Particularly preferable examples thereof include 46DMOC and 46DMOEP (trade names, Asahi Organic Chemicals Industry Co., Ltd.), DML-MBPC, DML-MBOC, DML-OCHP, DML-PC, DML-PCHP, DML-PTBP, DML-34×, DML-EP, DML-POP, dimethylol-Bis OC-P, DML-PFP, DML-PSBP, and DML-MTris PC (trade names, Honshu Chemical Industry Co., Ltd.), Nikalac MX-290 (trade name, Sanwa Chemical Co., Ltd.), B-a type benzoxazine and B-m type benzoxazine (trade names, Shikoku Chemicals Corp.), 2,6-dimethoxymethyl-4-t-butylphenol, 2,6-dimethoxymethyl-p-cresol, and 2,6-diacetoxymethyl-p-cresol, TriML-P and TriML-35XL, (trade names, Honshu Chemical Industry Co., Ltd.), TM-BIP-A (trade name, Asahi Organic Chemicals Industry Co., Ltd.), TML-BP, TML-HQ, TML-pp-BPF, TML-BPA, and TMOM-BP (trade names, Honshu Chemical Industry Co., Ltd.), Nikalac MX-280 and Nikalac MX-270 (trade names, Sanwa Chemical Co., Ltd.), and HML-TPPHBA and HML-TPHAP (trade names, Honshu Chemical Industry Co., Ltd.). Examples of more preferable compounds include alicyclic compounds, such as Nikalac MX-280 and Nikalac MX-270 (trade names, Sanwa Chemical Co., Ltd.), B-a type benzoxazine and B-m type benzoxazine (trade names, Shikoku Chemicals Corp.), and Nikalac MW-390 and Nikalac MW-100LM (trade names, Sanwa Chemical Co., Ltd.).

The resin compounds obtained with the addition of such compounds (d) brings about thermally-induced crosslinking at the time of heat treatment, which further reduces the rate of shrinkage.

Among these thermally crosslinkable compounds (d), a compound having a methylol group or a substituted methylol group that is formed by substituting a hydrogen atom of an alcoholic hydroxyl group of a methylol group, forms crosslinks by a reaction mechanism that binds directly to benzene rings as shown below.

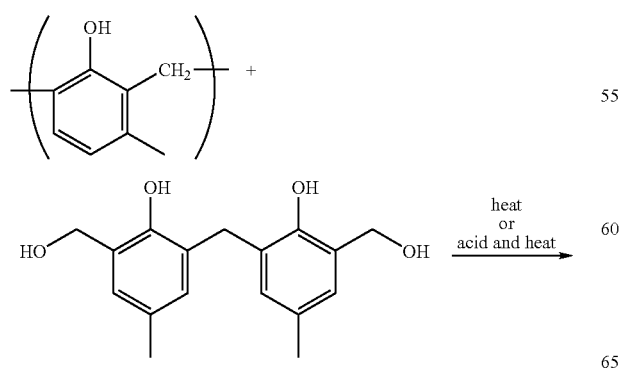

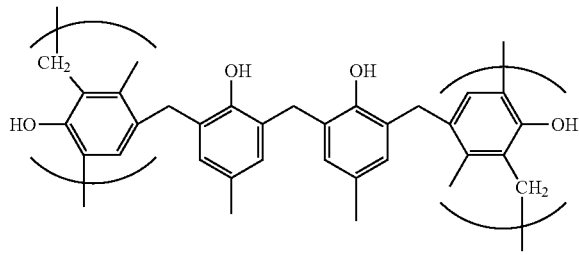

The structures of representative thermally crosslinkable compounds that are particularly preferably used in the present invention are shown below:

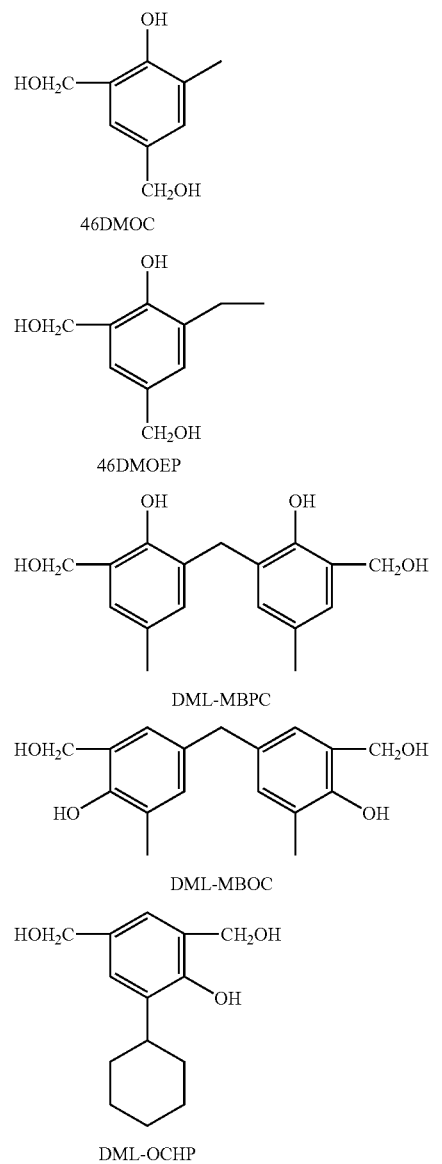

-continued
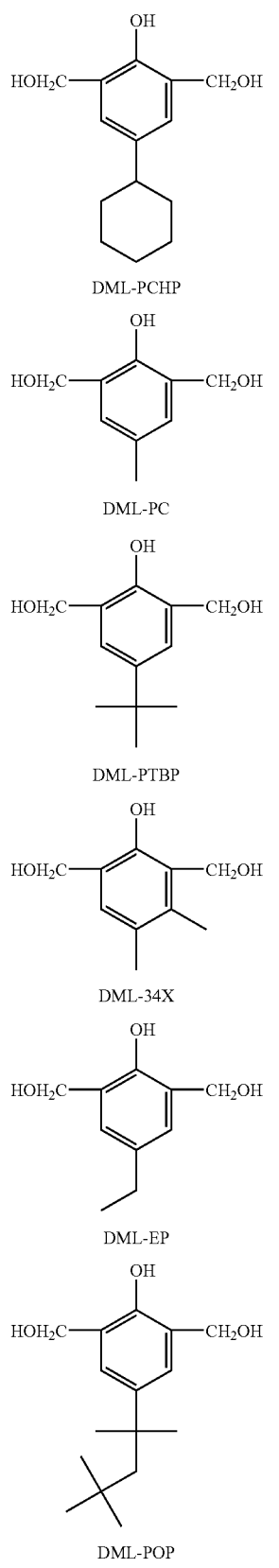
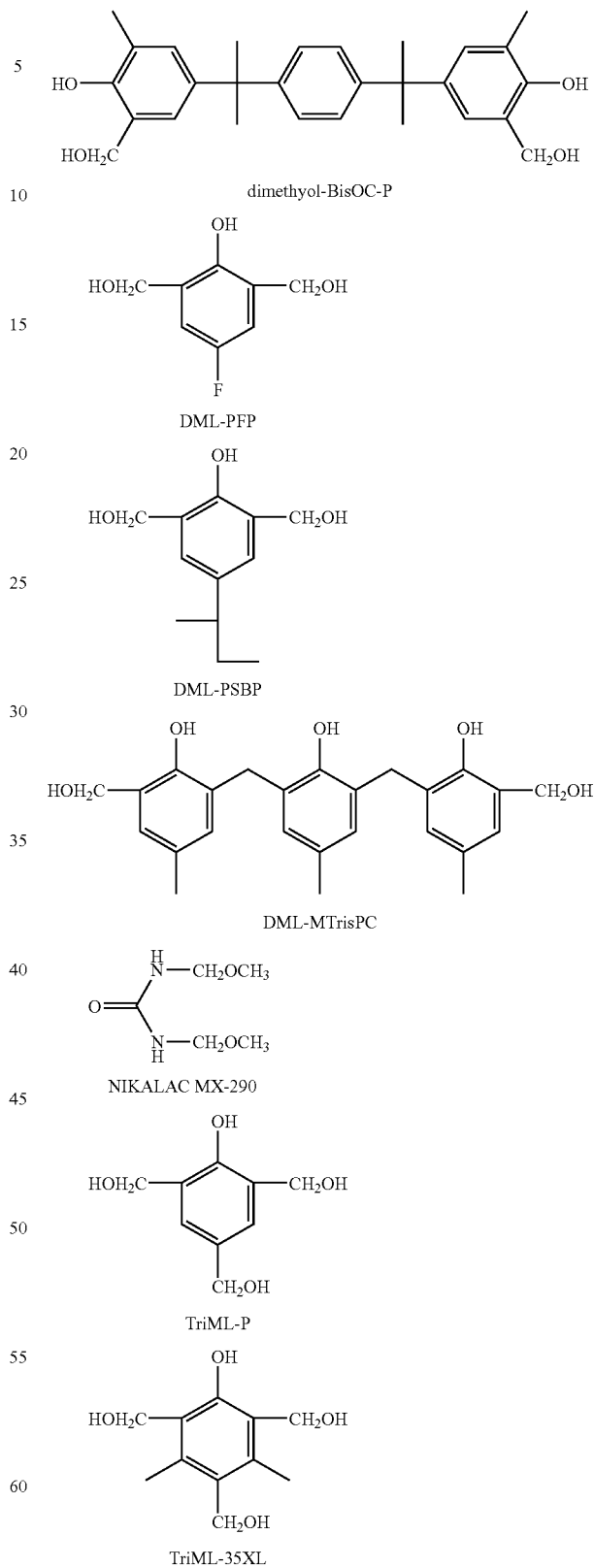

-continued
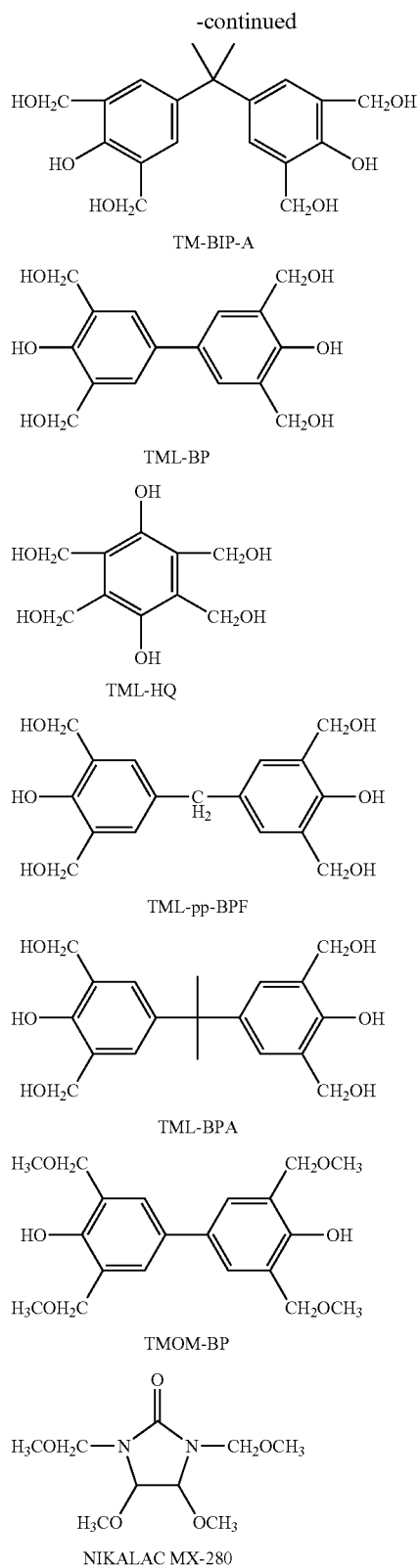
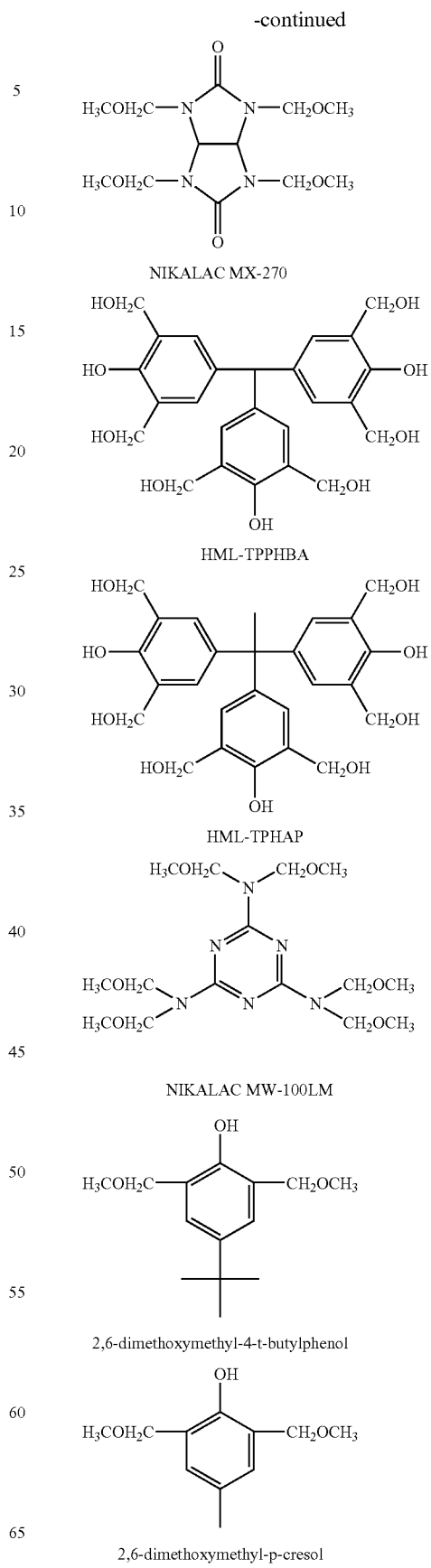

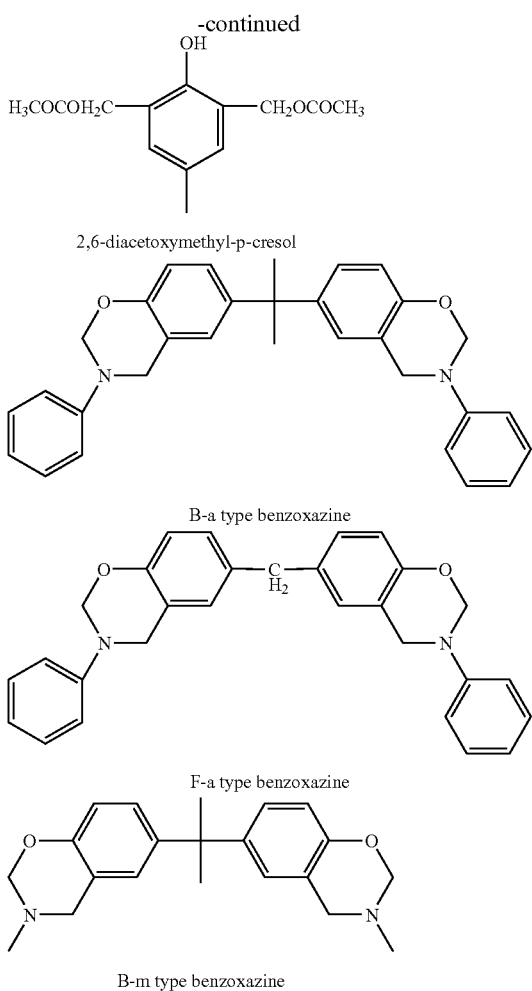

2,6-diacetoxymethyl-p-cresol

B-a type benzoxazine

F-a type benzoxazine

B-m type benzoxazine

The amount of such thermally crosslinkable compound to be added is preferably 0.5 to 150 parts by weight, and more preferably 1 to 130 parts by weight, based on 100 parts by weight of the polymer in the component (a). When the amount of the thermally crosslinkable compound (d) to be added is larger than 150 parts by weight based on 100 parts by weight of the component (a), the resin content becomes too small, which deteriorates the heat resistance of the photosensitive resin film. When such amount is smaller than 0.5 parts by weight, an increase in a molecular weight caused by crosslinking is small, which also deteriorates the heat resistance of the photosensitive resin film.

The colorant (e) used in the present invention blocks a stray light from the light-emitting area in the insulation film of the organic electroluminescent element. Such colorant shields the circuit wirings on the substrate in the solder resist coating of the circuit board.

Examples of the colorant (e) used in the present invention include a dye, a thermo-sensitive dye, an inorganic pigment, and an organic pigment. Preferable colorants are soluble in an organic solvent that dissolves the component (a) and are compatible with resins. Of these colorants, dyes are, for example, an oil-soluble dye, a disperse dye, a reactive dye, an acid dye, and a direct dye. The skeleton of the dye may be formed of an anthraquinone dye, an azo dye, a phthalocyanine dye, a methine dye, or an oxazine dye. These dyes may each contain a metal complex salt. Preferably, a phthalocyanine dye or a metal-complex-salt-containing dye is used from the viewpoint of excellent heat resistant and light resistant properties. Specific examples of such dyes include Sumilan and Lanyl dyes (Sumitomo Chemical Industry Co., Ltd.), Orasol, Oracet, Filamid, and Irgasperse dyes (Ciba Specialty Chemicals Co., Ltd.), Zapon, Neozapon, Neptune, and Acidol dyes (BASF), Kayaset and Kayakalan dyes (Nippon Kayaku Co., Ltd.), Valifast colors dyes (Orient Chemical Co., Ltd.), Savinyl, Sandoplast, Polysynthren, and Lanasyn dyes (Clariant Japan Co., Ltd.), and Aizen Spilon dyes (Hodogaya Chemical Co., Ltd.). These dyes may be used alone or in combination.

The thermo-sensitive dye that is used in the present invention preferably develops color via heating and exhibits the absorption peak at 350 nm to 700 nm, which may be a general thermo-sensitive dye or pressure-sensitive dye. Examples of such thermo-sensitive dye include those which develop color by changing the chemical structures or state of electric charge by the action of acidic groups exiting in the system during heating, and those which develop color by thermal oxidation reaction or the like with the oxygen in the air. Examples of the skeleton structure of the thermo-sensitive dye include a triarylmethane skeleton, a diarylmethane skeleton, a fluorane skeleton, a bislactone skeleton, a phthalide skeleton, a xanthene skeleton, a rhodamine lactam skeleton, a fluorene skeleton, a phenothiazine skeleton, a phenoxazine skeleton, and a spiropyran skeleton.

Specific examples of the thermo-sensitive dyes of the present invention include 4,4',4"-tris(dimethylamino)triphenylmethane, 4,4',4"-tris(diethylamino)-2-,2',2"-trimethyltriphenylmethane, 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(3-hydroxyphenyl)methylene]bis[2,6-dimethylphenol], 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(3-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4'''-(1,2-ethanediylidene)tetrakisphenol, 4,4',4",4'''-(1,2-ethanediylidene)tetrakis[2-methylphenol], 4,4',4",4'''-(1,2-ethanediylidene)tetrakis[2,6-dimethylphenol], 4,4',4",4'''-(1,4-phenylenedimethylidene)tetrakisphenol, 4,4',4",4'''-(1,4-phenylenedimethylidene)tetrakis(2,6-dimethylphenol), 4,4'-[(2-hydroxyphenyl)methylene]bis[3-methylphenol], 2,2'-[(3-hydroxyphenyl)methylene]bis[3,5-dimethylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 2,2'-[(3-hydroxy-4-methoxyphenyl)methylene]bis[3,5- dimethylphenol], 4,4'-[(2-hydroxyphenyl)methylene]bis[2-methylethylphenol], 4,4'-[(3-hydroxyphenyl)methylene]bis[2-methylethylphenol], 4,4'-[(4-hydroxyphenyl)methylene]bis[2-methylethylphenol], 2,2'-[(3-hydroxyphenyl)methylene]bis[3,5,6-trimethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(3-hydroxy-4-methoxyphenyl)methylene]bis[2-(methylethyl)phenol], 4,4'-[(4-hydroxy-3-methoxyphenyl)methylene]bis[2-(methyl ethyl)phenol], 2,2'-[(2-hydroxy-3-methoxyphenyl)methylene]bis[3,5,6-trimethylphenol], 2,2'-[(3-hydroxy-4-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'[(2-hydroxyphenyl)methylene]bis[2-cyclohexylphenol], 4,4'-[(3-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(3-hydroxy-4-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol, 4,4'-(3,5-dimethyl-4-hydroxyphenylmethylene)-bis(2,6-dimethylphenol), 3,3-bis(p-dimethylaminophenyl)-6-dimethylaminophthalide, 3,6-bis(dimethylamino)fluorane-γ-(4'-nitro)-aminolactam, 2-(2-chloroanilino)-6-diethylaminofluorane, 2-(2-chloroanilino)-6-dibutylaminofluorane, 2-N,N-dibenzylamino-6-diethylaminofluorane, 6-diethylamino-benzo [a]-fluorane, 2,2'-bis(2-chlorophenyl)-4,4',5,5'-tetraphenyl-1,2'-bi(imidazole), 1,3-dimethyl-6-diethylaminofluorane, 2-anilino-3-methyl-6-dibutylaminofluorane, 3,7-bis(dimethylamino)-10-benzoylphenothiazine, 3-diethylamino-6-chloro-7-(β-ethoxyethylamino)fluorane, 3-diethylamino-6-methyl-7-anilinofluorane, 3-triethylamino-6-methyl-7-anilinofluorane, and 3-cyclohexylamino-6-methyl-7-anilinofluorane.

Among these compounds, hydroxyl-group-containing compounds having a triarylmethane skeleton, such as 2,4',4"-methylidenetrisphenol, 4,4',4"-methylidenetrisphenol, 4,4'-[(4-hydroxyphenyl)methylene]bis(benzeneamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethylphenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,4',4",4'''-(1,2-ethanediylidene)tetrakisphenol, 4,4',4",4'''-(1,2-ethanediylidene)tetrakis[2-methylphenol], 4,4',4",4'''-(1,2-ethanediylidene)tetrakis[2,6-dimethylphenol], 4,4',4',4'''-(1,4-phenylenedimethylidene)tetrakisphenol, 4,4',4",4'''-(1,4-phenylenedimethylidene)tetrakis(2,6-dimethylphenol), 4,4'-[(2-hydroxyphenyl)methylene]bis[3-methylphenol], 4,4'-[(2-hydroxy-3-methoxyphenyl)methylene]bis[2,5-dimethylphenol], 4,4'-[(2-hydroxy-3-methoxyphenyl)methylene]bis[2,6-dimethylphenol], 2,2'-[(2-hydroxy-3-methoxyphenyl)methylene]bis[3,5-dimethylphenol], 4,4'-[(2-hydroxyphenyl)methylene]bis[2-methylethylphenol], 4,4'-[(4-hydroxyphenyl)methylene]bis[2-methylethylphenol], 2,2'-[(4-hydroxyphenyl)methylene]bis[3,5,6-trimethylphenol], 2,2'-[(4-hydroxy-3-ethoxyphenyl)methylene]bis[3,5-dimethylphenol], 4,4'-[(2-hydroxy-3-methoxyphenyl)methylene]bis[2-(methylethyl)phenol], 4,4'-[(4-hydroxy-3-methoxyphenyl)methylene]bis[2-(methylethyl)phenol], 2,2'-[(2-hydroxy-3-methoxyphenyl)methylene]bis[3,5,6-trimethylphenol], 2,2'-[(4-hydroxy-3-methoxyphenyl)methylene]bis[3,5,6-trimethylphenol], 4,4'-[(4-hydroxy-3-ethoxyphenyl)methylene]bis[2-(methylethyl)phenol], 2,2'-[(4-hydroxy-3-ethoxyphenyl)methylene]bis[3,5,6-trimethylphenol], 4,4'-[(4-hydroxy-3-ethoxyphenyl)methylene]bis[2,3,6-trimethylphenol], 4,4'-[(4-hydroxy-3-methoxyphenyl)methylene]bis[2-(1,1-dimethylethyl)-5-methylphenol], 4,4'-[(2-hydroxyphenyl)methylene]bis[2-cyclohexylphenol], 4,4'-[(4-hydroxyphenyl)methylene]bis[2-cyclohexylphenol], 4,4'-[(2-hydroxy-3-methoxyphenyl)methylene]bis[2-cyclohexylphenol], 4,4'-[(4-hydroxy-3-ethoxyphenyl)methylene]bis[2-(1,1-dimethylethyl)-6-methylphenol], 4,4'-[(4-hydroxy-3-ethoxyphenyl)methylene]bis[2-cyclohexyl-5-methylphenol], 4,4',4"-methylidenetris[2-cyclohexyl-5-methylphenol], 2,2'-[(3,4-dihydroxyphenyl)methylene]bis[3,5-dimethylphenol], 4,4'-[(3,4-dihydroxyphenyl)methylene]bis[2-(methylethyl)phenol], 2,2'-[(3,4-dihydroxyphenyl)methylene]bis[3,5,6-trimethylphenol], 4,4'-[(3,4-dihydroxyphenyl)methylene]bis[2-cyclohexylphenol], 3,3'-[(2-hydroxyphenyl)methylene]bis[5-methylbenzene-1,2-diol], 4,4'-[4-[[bis(4-hydroxy-2,5-dimethylphenyl)methyl]phenyl]methylene]bis[1,3-benzenediol], 4,4'-methylenebis[2-[di(4-hydroxy-3-methylphenyl)]methyl]phenol, 4,4'-methylenebis[2-[di(4-hydroxy-2,5-dimethylphenyl)]methyl]phenol, 4,4'-methylenebis[2-[di(4-hydroxy-3,5-dimethylphenyl)]methyl]phenol, 4,4'-methylenebis[2-[di(3-cyclohexyl-4-hydroxy-6-methylphenyl)]methyl]phenol, and 4,4'-(3,5-dimethyl-4-hydroxyphenylmethylene)-bis(2,6-dimethylphenol), are particularly preferable in terms of their excellent heat resistance. They may be used alone or in combination.

Color development of thermo-sensitive dye compounds is preferably induced by heat at a temperature higher than 120° C., and more preferably higher than 180° C. A thermo-sensitive compound having a higher color-developing temperature has better heat resistance at high temperature, and has better light fastness since discoloration is less likely to occur due to irradiation with ultraviolet or visible radiation for a long period of time.

The organic pigment used in the present invention preferably exhibits good coloration and high heat resistance. In particular, it is preferable that the organic pigment comprises carbon black and/or a combination of two or more organic pigments. Examples of such carbon blacks include: furnace blacks, such as HCF, MCF, LFF, RCF, SAF, ISAF, HAF, XCF, FEF, GPF, and SRF; thermal blacks, such as FT and MT; channel blacks; and acetylene blacks. These carbon blacks may be used alone or in combinations of two or more.

Preferably, the organic pigments that are used in the present invention have excellent heat resistance. Specific examples of representative pigments are listed below by color index (CI) numbers. Yellow pigments include, for example, Pigment Yellows 12, 13, 14, 17, 20, 24, 31, 55, 83, 86, 93, 94, 109, 110, 117, 125, 137, 138, 139, 147, 148, 150, 153, 154, 155, 166, 168, 173, 180, and 185. Orange pigments include, for example, Pigment Oranges 13, 31, 36, 38, 40, 42, 43, 51, 55, 59, 61, 64, 65, and 71. Red pigments include, for example, Pigment Reds 9, 97, 122, 123, 144, 149, 166, 168, 176, 177, 180, 190, 192, 209, 215, 216, 224, 242, and 254. Violet pigments include, for example, Pigment Violets 19, 23, 29, 32, 33, 36, 37, and 38. Blue pigments include, for example, Pigment Blues 15 (15:3, 15:4, 15:6), 21, 22, 60, and 64. Green pigments include, for example, Pigment Greens 7, 10, 36, and 47.

The inorganic pigment that is used in the present invention is preferably an insulative metal compound. Use of an inorganic pigment with poor electric insulating capacity results in insufficient functions as an insulation film of an organic electroluminescent device. If a luminescent element is prepared, such a pigment could cause a short circuit that results in a serious problem. Such insulative metal compounds include manganese oxide, titanium oxide, titanium oxide nitride, chromium oxide, vanadium oxide, iron oxide, cobalt oxide, and niobium oxide. Among these compounds, manganese oxide and titanium oxide nitride are preferable in the present invention. The manganese oxide is generally expressed by $Mn_xO_y$ ($1<y<x\leqq2$). Specifically, the manganese oxide may be $\gamma$-$MnO_2$, $\beta$-$MnO_2$, $\alpha$-$MnO_2$, $Mn_2O_3$, or $Mn_3O_4$. Amorphous $Mn_xO_y$ ($1<y<x\leqq2$) may also be used. Preferably, the primary particle size of the manganese oxide is 100 nm or less, and more preferably 60 nm or less. The primary particle size can be determined by the arithmetic mean using an electron microscope.

Titanium oxide nitride that is preferably used in the present invention generally has a composition expressed by $TiN_\alpha O_\beta$ ($0<\alpha<2$, $0.1<\beta<2$). The primary particle size of the titanium oxide nitride is preferably 100 nm or less, and more preferably 60 nm or less, as with the manganese oxide.

The amount of the colorant (e) of the present invention to be added is preferably 0.2 to 100 parts by weight, and more preferably 0.4 to 70 parts by weight, based on 100 parts by weight of the component (a). When the amount the colorant (e) to be added is larger than 100 parts by weight based on 100 parts by weight of the component (a), the resin content becomes too small, which deteriorates the adhesion of the photosensitive resin film to the substrate. When such amount is smaller than 0.2 parts by weight, the photosensitive resin film loses its function as a shield.

In the present invention, the surfaces of the organic pigments and the inorganic pigments may be treated with rosin, an acidic group, a basic group, or the like, according to need. The pigment can be used together with a dispersant. Examples of a dispersant include cationic, anionic, nonionic, amphoteric, silicone, and fluorine surfactants.

The colorant as the component (e) of the photosensitive resin composition according to the present invention functions as a solder resist coating, light-shading separator of an organic electroluminescent display unit or a liquid crystal display unit, black matrix, or shield. In order to exhibit such functions, the colorant preferably exhibits absorption in a wide region covering from the infrared region to the ultraviolet region according to the applications. Coloring can be carried out with the use of at least one type of dye or pigment, a combination of two or more types of dyes or two or more types of pigments, or a combination of at least one type of dye or pigment with at least one other type of dye or pigment.

Further, a compound having a phenolic hydroxyl group can be incorporated in order to control the alkali developability of the composition.

Examples of compounds having a phenolic hydroxyl group that can be used in the present invention include Bis-Z, Bis OC-Z, Bis OPP-Z, Bis P-CP, Bis26X-Z, Bis OTBP-Z, Bis OCHP-Z, Bis OCR-CP, Bis P-MZ, Bis P-EZ, Bis26X-CP, Bis P-PZ, Bis P-IPZ, Bis CR-IPZ, Bis OCP-IPZ, Bis OIPP-CP, Bis26X-IPZ, Bis OTBP-CP, TekP-4HBPA (tetrakis P-DO-BPA), Tris P-HAP, Tris P-PA, Bis OFP-Z, Bis RS-2P, Bis PG-26x, Bis RS-3P, Bis OC-OCHP, Bis PC-OCHP, Bis25X-OCHP, Bis26X-OCHP, Bis OCHP-OC, Bis236T-OCHP, methylenetris-FR-CR, Bis RS-26x, and Bis RS-OCHP (trade names, Honshu Chemical Industry Co., Ltd.), and BIR-OC, BIP-PC, BIR-PC, BIR-PTBP, BIR-PCHP, BIP-BIOC-F, 4PC, BIR-BIPC-F, and TEP-BIP-A (trade names, Asahi Organic Chemicals Industry Co., Ltd.).

Among these compounds, preferable phenolic hydroxyl-group-containing compounds are, for example, Bis-Z, Bis P-EZ, TekP-4HBPA, Tris P-HAP, Tris P-PA, Bis OCHP-Z, Bis P-MZ, Bis P-PZ, Bis P-IPZ, Bis OCP-IPZ, Bis P-CP, Bis RS-2P, Bis RS-3P, Bis P-OCHP, methylenetris-FR-CR, Bis RS-26x, BIP-PC, BIR-PC, BIR-PTBP, and BIR-BIPC-F. Bis-Z, TekP-4HBPA, Tris P-HAP, Tris P-PA, Bis RS-2P, Bis RS-3P, BIR-PC, BIR-PTBP, BIR-BIPC-F, and the like are particularly preferable. With the addition of such compound, the resulting resin composition is easily soluble in an alkaline developer before exposure and becomes hardly soluble therein by exposure. Consequently, a reduction in film thickness caused by developing is small and developing can be readily completed within a short period of time.

The content of the compound having a phenolic hydroxyl group is preferably in the range of 1 to 60 parts by weight, and more preferably in the range of 3 to 50 parts by weight, based on 100 parts by weight of the polymer.

In addition, in order to enhance the wettability between the photosensitive resin composition and a substrate, a surfactant, esters, such as ethyl lactate or propylene glycol monomethyl ether acetate, alcohols, such as ethanol, ketones, such as cyclohexanone or methyl isobutyl ketone, or ethers, such as tetrahydrofuran or dioxane may be added, according to need. Also, inorganic particles of silicon dioxide, titanium dioxide, or the like or polyimide powder may be added.

Furthermore, in order to enhance adhesion with a base substrate such as a silicon wafer, 0.5 to 10% by weight of a silane coupling agent or a titanium chelating agent may be added to a varnish, which is the photosensitive resin composition. Alternatively, the base substrate may be subjected to pretreatment with such chemical.

When adding a chemical to the varnish, a silane coupling agent, such as methylmethacryloxydimethoxysilane or 3-aminopropyltrimethoxysilane, a titanium chelating agent, or an aluminum chelating agent is added in an amount of 0.5 to 10% by weight based on the amount of the polymer in the vanish.

When treating the substrate, the aforementioned coupling agent is dissolved in a solvent such as isopropanol, ethanol, methanol, water, tetrahydrofuran, propylene glycol monomethyl ether acetate, propylene glycol monomethyl ether, ethyl lactate, or diethyl adipate in amounts of 0.5 to 20% by weight thereof. The resulting solution is applied to the surface of the substrate via spin coating, immersion, spray coating, or steaming. In some cases, the coupling agent and the substrate are heated to a temperature of 50° C. to 300° C. to allow the reaction of the coupling agent with the substrate to proceed.

The photosensitive resin composition of the present invention does not comprise an onium salt, diallyl compound, or tetraalkylammonium salt in order to block the dissolution of the component (a) in an aqueous alkaline solution. When such substance is contained, decomposition takes place at the time of subsequent heat treatment, and an acid or base is generated. This can deteriorate the properties of the resulting film, such as heat resistance, mechanical properties, and adhesiveness.

In the present invention, the components (a) to (e) and a compound having phenolic hydroxyl group are used while being dissolved and/or dispersed in an organic solvent.

An organic solvent used herein preferably has a boiling point of 80° C. to 250° C. at atmospheric pressure.

Examples of the organic solvent used in the present invention include: ethers, such as ethylene glycol monomethyl ether, ethylene glycolmonoethyl ether, propylene glycol monomethyl ether, propylene glycol monoethyl ether, ethylene glycol dimethyl ether, ethylene glycol diethyl ether, and ethylene glycol dibutylether; acetates, such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, and butyl lactate; ketones, such as acetylacetone, methylpropylketone, methylbutylketone, methylisobutylketone, cyclopentanone, and 2-heptanone; alcohols, such as butyl alcohol, isobutyl alcohol, pentanol, 4-methyl-2-pentanol, 3-methyl-2-butanol, 3-methyl-3-methoxy butanol, and diacetone alcohol; aromatic hydrocarbons, such as toluene and xylene; and N-methyl-2-pyrrolidone, N-cyclohexyl-2-pyrrolidone, N,N-dimethylformamide, N,N-dimethylacetamide, dimethylsulfoxide, and γ-butyrolactone. Among them, compounds capable of dissolving the component (a) and having a boiling point of 100° C. to 180° C. at atmospheric pressure are particularly preferable. If a boiling point is lower than 100° C., some type of composition may not be applied because of vaporization of a solvent at the time of coating. If a boiling point exceeds 180° C., the temperature at which the composition is heat-treated becomes high, and the material of the base substrate is disadvantageously restricted in practical use. Also, use of a solvent capable of dissolving component (a) enables the formation of a homogenous coating as a base substrate.

Specific examples of particularly preferable solvents include cyclopentanone, ethylene glycol monomethyl ether, ethylene glycol monoethyl ether, propylene glycol monomethyl ether, methyl lactate, ethyl lactate, diacetone alcohol, and 3-methyl-3-methoxybutanol.

The amount of the organic solvent used in the resin composition of the present invention is preferably 20 to 800 parts by weight, and more preferably 30 to 500 parts by weight, based on 100 parts by weight of the polymer in the component (a). They may be used alone or in combination.

Subsequently, a method for forming heat resistant resin patterns using the photosensitive composition of the present invention is described.

The photosensitive resin composition is applied to a substrate. A silicon wafer, ceramics, gallium arsenide, and the like are used as the substrate, although the substrate is not limited thereto. The composition may be applied via, for example, spin coating with spinner, spray coating, or roll coating. The thickness of the coated film depends on a means of application, a solid content in the composition, the viscosity of the composition, and the like. Coating is generally applied to a thickness of 1 to 150 µm on a dry basis.

The substrate coated with the photosensitive resin composition is then dried to form a film of the photosensitive resin composition. Drying is preferably performed at a temperature of 50° C. to 150° C. for a period of 1 minute to several hours using an oven, a hot plate, infrared rays, or the like.

The film of the photosensitive resin composition is then exposed to actinic rays through a mask having a desired pattern. Ultraviolet light, visible light, electron rays, and X rays are generally used as the actinic rays. In the present invention, i rays (365 nm), h rays (405 nm), or g rays (436 nm) from a mercury vapor lamp is preferably used.

In order to form a pattern of resin composition, unexposed regions of the film are removed with a developer after developing.

As the developer, for example, N-methyl-2-pyrrolidone, N-acetyl-2-pyrrolidone, N,N-dimethylformamide, N,N-dimethylacetamide, dimethylsulfoxide, or hexamethylphosphortriamide may be used alone. Alternatively, such developer may be dissolved in: for example, organic solvents, such as methanol, ethanol, isopropyl alcohol, methyl carbitol, ethyl carbitol, toluene, xylene, ethyl lactate, ethyl pyruvate, propylene glycol monomethyl ether acetate, methyl-3-methoxypropionate, ethyl-3-ethoxypropionate, 2-heptanone, or ethyl acetate; an aqueous solution of tetramethylammonium; or an aqueous solution of an alkaline compound, such as diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethylmethacrylate, cyclohexylamine, ethylenediamine, or hexamethylenediamine. Particularly preferably, the developer is dissolved in an aqueous solution of tetramethylammonium and an aqueous solution of an alkaline compound such as diethanolamine, diethylaminoethanol, sodium hydroxide, potassium hydroxide, sodium carbonate, potassium carbonate, or triethylamine. If necessary, the aforementioned aqueous alkaline solution may be combined with a single type or a combinations of two or more of polar solvents, such as N-methyl-2-pyrrolidone, N,N-dimethylformamide, N,N-dimethylacetamide, dimethylsulfoxide, γ-butyrolactone, or dimethylacrylamide, alcohols, such as methanol, ethanol, or isopropanol, esters, such as ethyl lactate, or propylene glycol monomethyl ether acetate, or ketones, such as cyclopentanone, cyclohexanone, isobutyl ketone, or methyl isobutyl ketone. After developing, the substrate is rinsed with water. Water may contain alcohols, such as ethanol or isopropyl alcohol, or esters, such as ethyl lactate or propylene glycol monomethyl ether acetate.

If the resolution of a developed pattern is improved or the permissible range of developing conditions is widened, a step of baking may be additionally carried out before developing. This process is preferably carried out at 50° C. to 180° C., and more preferably at 60° C. to 150° C. The duration thereof is preferably between 10 seconds and several hours. Beyond such ranges, the reaction may not be proceeded, or all the regions may not be dissolved. Accordingly, it must be proceeded with caution.

After developing, a resin film is formed by heating at 120° C. to 280° C. Heat treatment is carried out by gradually raising the temperature by selecting the temperatures or continuously raising the temperature by selecting a given range of temperature for 5 minutes to 5 hours. For example, heat treatment is carried out by heating at 130° C., 200° C., and 350° C. for 30 minutes each. Alternatively, temperature is linearly raised from room temperature to 400° C. over the period of 2 hours.

The heat resistant resin film prepared from the photosensitive resin composition of the present invention is used as a passivation film of semiconductors, a protective film of semiconductor devices, an interlayer insulation film of multilayer wirings for high-density packing, an insulation layer for protecting wirings of the circuit board, and other films.

The composition of the present invention can be used as an insulation layer provided for a display unit. For example, a display unit comprising an insulation layer comprises a first electrode formed on a substrate and a second electrode provided opposing the first electrode. Specific examples of display units include those comprising LCD, ECD, ELD, and an organic electroluminescent element (an organic electroluminescent device).

EXAMPLES

It should be noted that the present invention is not limited to these examples. The photosensitive resin composition and the like were evaluated in the following manner.

Measurement of the Rate of Imide Conversion

The rate of imide conversion of the polymer used was calculated in the following manner. At the outset, the infrared absorption spectrum of the polymer was measured, and the absorption peaks of the polyimide imide structure were detected at around 1780 cm$^1$ and 1377 cm$^{-1}$. Subsequently, the polymer was subjected to heat treatment at 350° C. in a nitrogen atmosphere for 1 hour, the infrared absorption spectrum was measured after heat treatment, and the obtained peak intensity at around 1377 cm$^{-1}$ was compared with the intensity before heat treatment to determine the rate of imide conversion in the polymer before heat treatment.

Formation of Photosensitive Resin Film

The photosensitive resin composition (hereinafter referred to as a varnish) was applied onto a 6-inch silicon wafer so that the thickness of the film would be 30 μm after prebaking, and was then prebaked at 100° C. for 2 minutes on a hot plate (Mark-7, Tokyo Electron Limited) to form a photosensitive resin film.

Measurement of Film Thickness

The thickness was measured at a refractive index of 1.73 using RamdaA STM-602 (Dainippon Screen Mfg. Co., Ltd.).

Exposure

A reticle having an incised pattern was set in an exposing machine (Spectrum 3e, all-wavelength stepper, Ultratech), and exposure was carried out in all wavelength ranges at an intensity of 700 mJ/cm$^2$ (in terms of i-line).

Post-exposure Baking

Before developing, the exposed film was subjected to post-exposure baking on a hot plate (Mark-7, Tokyo Electron Limited) at 60° C. for 1 minute.

Developing

An aqueous solution of 2.38% tetramethylammonium hydroxide was sprayed for 10 seconds at 50 rotations using a developing machine of Mark-7 (Tokyo Electron Ltd.). The film was then allowed to stand for 60 seconds at 0 rotation, rinsed with water at 400 rotations, and dried by spinning for 10 seconds at 3,000 rotations.

Heat Treatment (Curing)

The developed film was subjected to heat treatment using an inert oven INH-21CD (Koyo Thermo Systems Co., Ltd.) at temperature and the time described in examples.

Calculation of the Film Retentivity

The film retentivity was calculated according to the following equation:

Film retentivity (%)=thickness of developed film/ thickness pre-baked film×100

Calculation of the Film Retentivity After Shrinkage

The film retentivity after shrinkage was calculated according to the following equation.

Film retentivity after shrinkage (%)=thickness of heat-treated film/thickness of developed film×100

Crack Resistance

The developed film was subjected to heat treatment under arbitrary conditions, and whether or not the corner of the 50-μm☐ punched pattern (i.e., a punched pattern of 50 μm×50 μm) was cracked (n=5) was observed under an optical microscope.

Stress Resistance

The developed film was subjected to heat treatment under arbitrary conditions, and whether or not the corner of the 50-μm☐ left pattern (i.e., a left pattern of 50 μm×50 μm) was wrinkled (n=5) was observed under an optical microscope.

Synthetic Example 1

Synthesis of Activated Ester Compound (I)

In a dry nitrogen gas stream, 18.5 g (0.1 mol) of 4-carboxybenzoic acid chloride and 13.5 g (0.1 mol) of hydroxybenzotriazole were dissolved in 100 g of tetrahydrofuran (THF), and the solution was cooled to −15° C. A solution of 10 g (0.1 mol) of triethylamine in 50 g of THF was added dropwise thereto, so that the temperature of the reaction solution did not exceed 0° C. After the dropwise addition, the mixture was allowed to react at 25° C. for 4 hours. The reaction solution was concentrated with a rotary evaporator to obtain an activated ester compound (I).

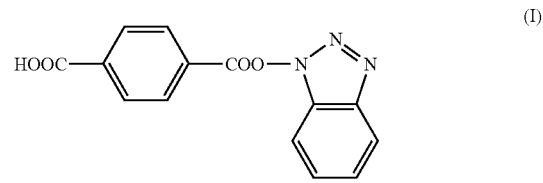

Synthetic Example 2

Synthesis of Hydroxyl-group-containing Acid Anhydride (II)

In a dry nitrogen gas stream, 18.3 g (0.05 mol) of 2,2-bis (3-amino-4-hydroxyphenyl)hexafluoropropane (BAHF) and 34.2 g (0.3 mol) of allyl glycidyl ether were dissolved in 100 g of gamma butyrolactone (GBL), and the resulting solution was cooled to −15° C. Subsequently, a solution of 22.1 g (0.11 mol) of trimellitic anhydride chloride in 50 g of GBL was added dropwise thereto, so that the temperature of the reaction solution did not exceed 0° C. After the dropwise addition, the mixture was allowed to react at 0° C. for 4 hours. The reaction solution was concentrated with a rotary evaporator, and the concentrated solution was added to 1 l of toluene to obtain the acid anhydride (II).

(II)

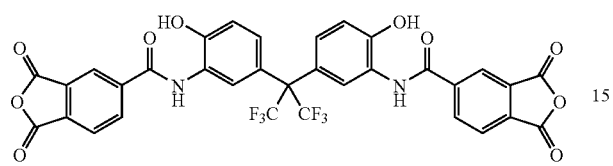

Synthetic Example 3

Synthesis of Hydroxyl-group-containing Diamine Compound (III)

BAHF (18.3 g, 0.05 mol) was dissolved in 100 ml of acetone and 17.4 g (0.3 mol) of propylene oxide, and the resulting solution was cooled to −15° C. Subsequently, a solution of 20.4 g (0.11 mol) of 4-nitrobenzoyl chloride in 100 ml of acetone was added dropwise thereto. After the dropwise addition, the mixture was allowed to react at −15° C. for 4 hours and the temperature of the mixture was then allowed to return to room temperature. White solid deposits were separated by filtration and were dried in vacuo at 50° C.

The solid (30 g) was placed in a 300 ml stainless-steel autoclave, dispersed in 250 ml of methyl cellosolve, and then blended with 2 g of 5% palladium-carbon. Hydrogen was introduced thereto by a balloon, and a reduction reaction was performed at room temperature. Approximately 2 hours thereafter, it was ensured that the balloon did not deflate any more, and the reaction was terminated. After the termination of the reaction, a palladium compound as a catalyst was removed by filtration, and the reaction solution was concentrated with a rotary evaporator to obtain a diamine compound (III). The obtained solid was used in the reaction in such a state.

(III)

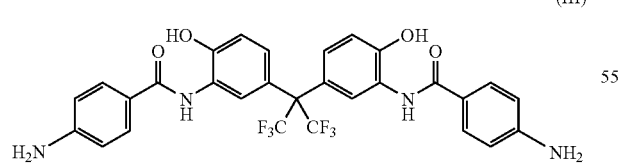

The compounds having phenolic hydroxyl groups used in the Examples and comparative examples are shown below.

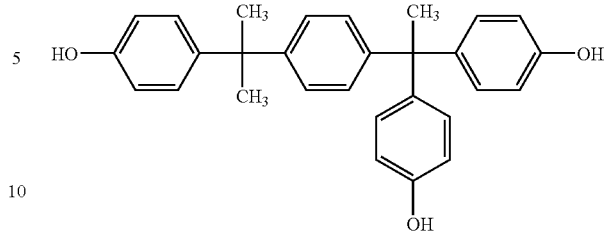

TrisP-PA

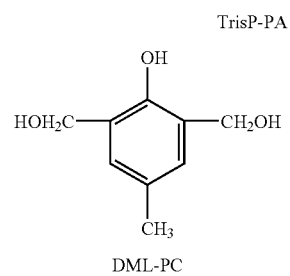

DML-PC

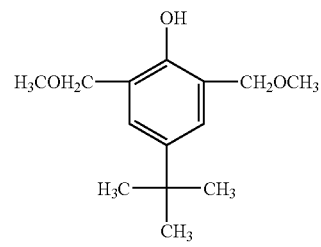

DMOM-PTBP

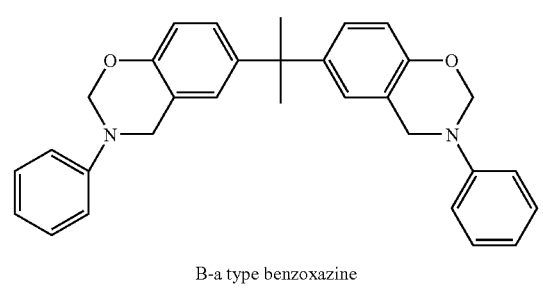

B-a type benzoxazine

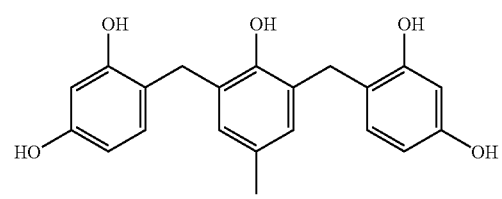

BIR-PC

TML-HQ

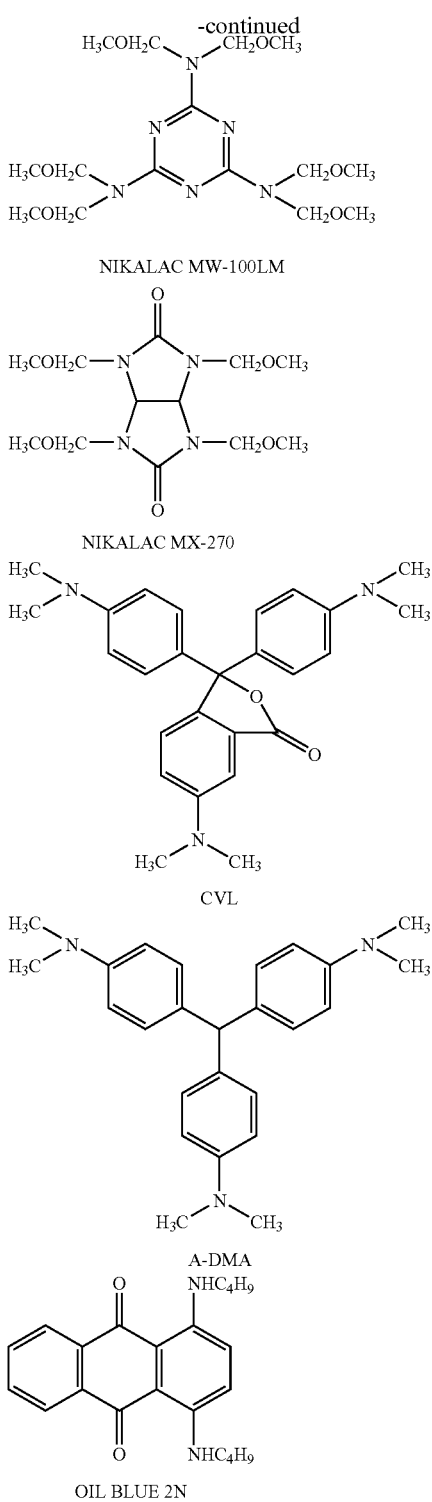

NIKALAC MW-100LM

NIKALAC MX-270

CVL

A-DMA

OIL BLUE 2N

Example 1

In a dry nitrogen gas stream, 11.41 g (0.057 mol) of 4,4'-diaminodiphenyl ether, 1.24 g (0.005 mol) of 1,3-bis(3-aminopropyl)tetramethyldisiloxane, and 8.18 g (0.075 mol) of 3-aminophenol (Tokyo Kasei Kogyo Co., Ltd.) as an endcap agent were dissolved in 80 g of N-methyl-2-pyrrolidone (NMP). Bis(3,4-dicarboxyphenyl)ether dianhydride (31.02 g, 0.1 mol) and 20 g of NMP were added thereto, and the mixture was allowed to react at 20° C. for 1 hour and then at 50° C. for 4 hours. Thereafter, 15 g of xylene was added thereto, water was subjected to azeotropy with xylene, and the mixture was agitated at 150° C. for 5 hours. After the completion of agitation, the solution was poured into 3 l of water, and white deposits were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were detected at around 1780 cm$^{-1}$ and 1377 cm$^{-1}$. The rate of imide conversion of the polymer solid mixture thus obtained was inspected.

Subsequently, 10 g of this polymer solid, 0.5 g of a photopolymerization initiator, i.e., bis(α-isonitrosopropiophenone oxime)isophthal, 1 g of a thermally crosslinkable compound Nikalac MX-270 (trade name, Sanwa Chemical Co., Ltd.), 2 g of Tris P-PA, and 5 g of trimethylolpropane diacrylate (a compound having a polymerizable functional group comprising unsaturated double bonds) were dissolved in 12 g of ethyl lactate to prepare a varnish A, which is a negative-working photosensitive polyimide composition. With the use of this varnish, a photosensitive polyimide film was formed on a silicon wafer as described above, exposed, post-exposure baked, developed in an alkaline developer, and then heat treated at 170° C. for 60 minutes. The alkaline developability of the varnish, the film retentivity, the film retentivity after shrinkage, the crack resistance, and stress resistance were evaluated.

Example 2

In a dry nitrogen gas stream, 49.57 g (0.082 mol) of the hydroxyl-group-containing diamine compound (III), which was obtained in Synthetic Example 3, and 9.9.1 g (0.035 mol) of the activated ester compound (I) as an endcap agent were dissolved in 150 g of NMP. Bis(3,4-dicarboxyphenyl)ether dianhydride (31.02 g, 0.1 mol) and 30 g of NMP were added thereto, and the mixture was allowed to react at 20° C. for 1 hour and then at 50° C. for 4 hours. Thereafter, the mixture was agitated at 180° C. for 5 hours. After the completion of agitation, the solution was poured into 3 l of water, and white deposits were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were detected at around 1780 cm$^{-1}$ and 1377 cm$^{-1}$. The rate of imide conversion of the polymer solid mixture thus obtained was inspected.

Subsequently, 10 g of the polymer solid, 2 g of a photopolymerization initiator, i.e., 2-benzyl-2-dimethylamino-1-(4-morpholinophenyl)-butanone-1, 5 g of pentaerythritol triacrylate (a compound having a polymerizable functional group comprising unsaturated double bonds), and 1 g of vinyltrimethoxysilane were dissolved in 10 g of γ-butyrolactone to prepare a varnish B, which is a negative-working photosensitive polyimide composition. With the use of this varnish, a photosensitive polyimide film was formed on a silicon wafer as described above, exposed, post-exposure baked, developed in an alkaline developer, and then heat treated at 200° C. for 60 minutes. The alkaline developability of the varnish, the film retentivity, the film retentivity after shrinkage, the crack resistance, and stress resistance were evaluated.

Example 3

In a dry nitrogen gas stream, 46.55 g (0.077 mol) of the hydroxyl-group-containing diamine compound (III), which was obtained in Synthetic Example 3, was dissolved in 250 g of NMP. The hydroxyl-group-containing acid anhydride (II) (71.45 g, 0.1 mol), which was obtained in Synthetic Example 2, and 7.38 g (0.045 mol) of 3-hydroxyphthalic anhydride (Tokyo Kasei Kogyo Co., Ltd.) as an endcap agent were added thereto, and the mixture was allowed to react at 60° C. for 6 hours. Thereafter, 15 g of xylene was added thereto, the reaction solution was subjected to azeotropy with xylene, and the mixture was agitated at 150° C. for 5 hours. After the completion of agitation, the solution was poured into 2 l of water, and white deposits were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were detected at around 1780 cm$^{-1}$ and 1377 cm$^{-1}$. The rate of imide conversion of the polymer solid mixture thus obtained was inspected.

Subsequently, 10 g of the polymer solid, 2.5 g of a photopolymerization initiator, i.e., 2-benzyl-2-dimethylamino-1-(4-morpholinophenyl)-butanone-1, 8 g of pentaerythritol triacrylate (a compound having a polymerizable functional group comprising unsaturated double bonds), 5 g of a thermally crosslinkable compound DML-PC (trade name, Honshu Chemical Industry Co., Ltd.), and 1 g of vinyltrimethoxysilane were dissolved in 10 g of 3-methyl-3-methoxybutanol to prepare a varnish C, which is a negative-working photosensitive polyimide composition. With the use of this varnish, a photosensitive polyimide film was formed on a silicon wafer as described above, exposed, post-exposure baked, developed in an alkaline developer, and then heat treated at 180° C. for 60 minutes. The alkaline developability of the varnish, the film retentivity, the film retentivity after shrinkage, the crack resistance, and stress resistance were evaluated.

Example 4

In a dry nitrogen gas stream, 40.5 g (0.067 mol) of the hydroxyl-group-containing diamine compound (III), which was obtained in Synthetic Example 3, and 1.24 g (0.005 mol) of 1,3-bis(3-aminopropyl)tetramethyldisiloxane were dissolved in 130 g of NMP. 3,3',4,4'-Biphenyltetracarboxylic acid dianhydride (29.42 g, 0.1 mol) and 20 g of NMP were added thereto, and the mixture was allowed to react at 20° C. for 1 hour and then at 50° C. for 2 hours. 4-Aminothiophenol (6.89 g, 0.055 mol, Tokyo Kasei Kogyo Co., Ltd.) was added thereto, and the mixture was agitated at 50° C. for 2 hours and then at 180° C. for 5 hours. After the completion of agitation, the solution was poured into 3 l of water, and white deposits were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were detected at around 1780 cm$^{-1}$) and 1377 cm$^{-1}$. The rate of imide conversion of the polymer solid mixture thus obtained was inspected.

Subsequently, 10 g of the polymer solid, 0.2 g of a photopolymerization initiator, i.e., N-phenylglycine, 0.4 g of bis (α-isonitrosopropiophenone oxime)isophthal, 0.3 g of a thermally crosslinkable compound TML-HQ (trade name, Honshu Chemical Industry Co., Ltd.), and 5.5 g of dimethylol-tricyclodecane diacrylate, (a compound having a polymerizable functional group comprising unsaturated double bonds), were dissolved in 13 g of propylene glycol monomethyl ether to prepare a varnish D, which is a negative-working photosensitive polyimide composition. With the use of this varnish, a photosensitive polyimide film was formed on a silicon wafer as described above, exposed, post-exposure baked, developed in an alkaline developer, and then heat treated at 150° C. for 60 minutes. The alkaline developability of the varnish, the film retentivity, the film retentivity after shrinkage, the crack resistance, and stress resistance were evaluated.

Example 5

In a dry nitrogen gas stream, 30.03 g (0.082 mol) of 2,2-bis(3-amino-4-hydroxyphenyl)hexafluoropropane (BAHF), 1.24 g (0.005 mol) of 1,3-bis(3-aminopropyl)tetramethyldisiloxane, and 2.73 g (0.025 mol) of 3-aminophenol (Tokyo Kasei Kogyo Co., Ltd.) as an endcap agent were dissolved in 100 g of NMP. Bis(3,4-dicarboxyphenyl)ether dianhydride (31.02 g, 0.10 mol) and 30 g of NMP were added thereto, and the mixture was allowed to react at 20° C. for 1 hour and then at 50° C. for 4 hours. The reaction product was then agitated at 180° C. for 5 hours. After the completion of agitation, the solution was poured into 3 l of water, and white deposits were collected by filtration. The collected deposits were washed three times with water and dried in a vacuum dryer at 200° C. for 5 hours. The resulting polymer solid was subjected to infrared absorption spectrum measurement, and the absorption peaks of the polyimide imide structure were detected at around 1780 cm$^{-1}$ and 1377 cm$^{-1}$. The rate of imide conversion of the polymer solid mixture thus obtained was inspected.

Subsequently, 10 g of the polymer solid, 0.4 g of a photopolymerization initiator, i.e., 1,2-octanedione,1-[4-(phenylthio)phenyl]-,2-(o-benzoyl oxime), 1.5 g of a thermally crosslinkable compound Nikalac MW-100 LM (trade name, Sanwa Chemical Co., Ltd.), 0.3 g of an A-DMA colorant (trade name, Hodogaya Chemical Co., Ltd.), and 10 g of trimethylolpropane triacrylate (a compound having a polymerizable functional group comprising unsaturated double bonds) were dissolved in 10 g of diacetone alcohol to prepare a varnish E, which is a negative-working photosensitive polyimide composition. With the use of this varnish, a photosensitive polyimide film was formed on a silicon wafer as described above, exposed, post-exposure baked, developed in an alkaline developer, and then heat treated at 180° C. for 60 minutes. The alkaline developability of the varnish, the film retentivity, the film retentivity after shrinkage, the crack resistance, and stress resistance were evaluated.

Example 6

The polymer solid obtained in Example 3 (10 g), 3 g of a photopolymerization initiator, i.e., 2-benzyl-2-dimethylamino-1-(4-morpholinophenyl)-butanone-1, 0.1 g of an Oil Blue 2N colorant (trade name, Orient Chemical Co., Ltd.), 0.2 g of a CVL colorant (trade name, Hodogaya Chemical Co., Ltd.), 3.5 g of dimethylol-tricyclodecane diacrylate (a compound having a polymerizable functional group comprising unsaturated double bonds), and 1.5 g of trimethylolpropane diacrylate were dissolved in 13 g of ethyl lactate to prepare a varnish F, which is a negative-working photosensitive polyimide composition. With the use of this varnish, a photosensitive polyimide film was formed on a silicon wafer as described above, exposed, post-exposure baked, developed in an alkaline developer, and then heat treated at 200° C. for 60 minutes. The alkaline developability of the varnish, the film retentivity, the film retentivity after shrinkage, the crack resistance, and stress resistance were evaluated.

Example 7

The polymer solid obtained in Example 4 (10 g), 1 g of a photopolymerization initiator, i.e., 1-phenyl-1,2-butanedione-2-(o-methoxycarbonyl)oxime, 1.7 g of a thermally crosslinkable compound DMOM-PTBP (trade name, Honshu Chemical Industry Co., Ltd.), 1.5 g of BIR-PC (trade name, Asahi Organic Chemicals Industry Co., Ltd.), 0.7 g of N-(3-diethylaminopropyl)methacrylamide (a compound having a polymerizable functional group comprising unsaturated double bonds), and 4.5 g of dimethylol-tricyclodecane diacrylate were dissolved in 12 g of γ-butyrolactone and 8 g of cyclopentanone to prepare a varnish G, which is a negative-working photosensitive polyimide composition. With the use of this varnish, a photosensitive polyimide film was formed on a silicon wafer as described above, exposed, post-exposure baked, developed in an alkaline developer, and then heat treated at 210° C. for 30 minutes. The alkaline developability of the varnish, the film retentivity, the film retentivity after shrinkage, the crack resistance, and stress resistance were evaluated.

Example 8

The polymer solid obtained in Example 5 (10 g), 0.5 g of a photopolymerization initiator, i.e., 1-phenyl-1,2-butanedione-2-(o-methoxycarbonyl)oxime, 0.8 g of a thermally crosslinkable compound B-a type benzoxazine (trade name, Shikoku Chemicals Corp.), 2.5 g of BIR-PC (trade name, Asahi Organic Chemicals Industry Co., Ltd.), and 4 g of N-vinylcaprolactam and 2.5 of dimethylol-tricyclodecane diacrylate, which are each a compound having a polymerizable functional group comprising unsaturated double bonds, were dissolved in 15 g of diacetone alcohol to prepare a varnish H, which is a negative-working photosensitive polyimide composition. With the use of this varnish, a photosensitive polyimide film was formed on a silicon wafer as described above, exposed, post-exposure baked, developed in an alkaline developer, and then heat treated at 180° C. for 30 minutes. The alkaline developability of the varnish, the film retentivity, the film retentivity after shrinkage, the crack resistance, and stress resistance were evaluated.

Example 9

An indium tin oxide (ITO) transparent electrode film having a thickness of 130 nm was formed on the surface of no-alkali glass having a thickness of 1.1 mm by means of sputtering vapor deposition so as to prepare a glass substrate. The glass substrate was cut into 120×100 mm. A photoresist was applied on the ITO substrate, and patterning was carried out via exposure and developing by a common photolithographic method. The unnecessary portions of the ITO were removed by etching, and the photoresist was then removed to form a striped pattern on the ITO film. The resulting striped first electrode had a pitch of 100 μm.

The density of the varnish A prepared in Example 1 was then adjusted with ethyl lactate. The adjusted varnish A was applied on the first electrodes on the substrate by means of spin-coating and was pre-baked on a hot plate at 100° C. for 3 minutes. The resulting film was exposed to UV light through a photomask, and the exposed portion was exclusively dissolved and developed in an aqueous solution of 2.38% TMAH. The resulting film was rinsed with pure water to obtain a polyimide pattern. The polyimide pattern was cured by heating in a nitrogen atmosphere in a clean oven at 170° C. for 30 minutes, and then at 170° C. for 60 minutes so as to form an insulation layer that covers the edges of the first electrodes. The thickness of the insulation layer was approximately 1 μm.

An organic electroluminescent device was prepared using the substrate provided with the insulation layer. A thin-film layer comprising a luminescent layer was vacuum-deposited by a resistance-wire heating method. A hole transport layer was formed on the entire effective area of the substrate by vapor deposition. A luminescent layer and an aluminum second electrode were formed with the use of a shadow mask.

The aforementioned substrate was removed from the deposition device. The substrate was bonded to a sealing glass plate with the aid of a curable epoxy resin so as to seal the substrate. Thus, a simple-matrix color organic electroluminescent device having a striped first electrode composed of ITO, a patterned luminescent layer formed on the first electrode, and a striped second electrode orthogonal to the first electrode was prepared. When this display unit was driven line-sequentially, good display characteristics were obtained. At the border areas of the insulation layer, neither the thin-film layer nor the second electrode suffered from thinning or stepped cuts, and they were deposited without trouble. As a result, the brightness within the luminescent region was even, and stable light emission was achieved. Moreover, the cross-section had a forward tapered shape.

Example 10

A simple-matrix color organic electroluminescent device was prepared in the same manner as in Example 9, except that the varnish C prepared in Example 3 was used and the curing was performed at 180° C. for 30 minutes. When the resulting device was driven line-sequentially, no degradation in the brightness was observed, and good display characteristics were obtained.

Example 11

A simple-matrix color organic electroluminescent device was prepared in the same manner as in Example 9, except that the varnish E prepared in Example 5 was used and the curing was performed at 200° C. for 30 minutes. When the resulting device was driven line-sequentially, no degradation in the brightness was observed, and good display characteristics were obtained.

Example 12

A simple-matrix color organic electroluminescent device was prepared in the same manner as in Example 9, except that the varnish G prepared in Example 7 was used and the curing was performed at 230° C. for 30 minutes. When the resulting device was driven line-sequentially, no degradation in the brightness was observed, and good display characteristics were obtained.

Example 13

A photosensitive polyimide insulation layer was formed on the first electrode on the substrate in the same manner as in Example 9, except that the curing was performed by heating in an air atmosphere in an oven at 180° C. for 30 minutes and the thickness of the insulation layer was made 3 µm. It was confirmed that the volume resistivity was at least $5\times10^{10}$ Ωcm. The cross-section of the border area of the insulation layer had a forward tapered shape. The cone angle was approximately 45°.

An organic electroluminescent device was prepared using the substrate provided with the insulation layer. The glass substrate provided with the insulation layer was subjected to an oxygen plasma process or UV irradiation. Thereafter, a hole injection material or a hole transportation material dissolved in alcohol was applied on the substrate by spin coating to form a film. The resulting film was heated in an oven at 180° C. for 30 minutes.

A pattern was formed at openings using red, blue, and green organic luminescent materials, which had been dissolved in toluene, by an inkjet method. The substrate was heated in an oven at 80° C. for 30 minutes. Finally, a second electrode was formed in the same manner as in Example 9 and sealing was performed.

The resulting simple-matrix color organic electroluminescent device was composed of: the striped first electrode composed of ITO comprising 816 strips at a pitch of 100 µm each having a width of 80 µm; patterned green, red, and blue luminescent layers arranged on the first electrode; and the striped second electrode comprising 200 strips at a pitch of 300 µm each having a width of 250 µm and was orthogonal to the first electrode. Since three luminescent regions in red, green, and blue constituted one pixel, the electroluminescent device of the present invention had 272×200 pixels at a pitch of 300 µm. Since the portions of the first electrode exposed by the insulation layer exclusively emitted light, one luminescent region had a rectangular shape with a width of 70 µm and a length of 250 µm.

When this device was driven line-sequentially, good display characteristics were obtained. Because the edge portions of the first electrode were covered with the insulation layer, no short-circuiting due to the field concentration was observed. Also, because the cross-section had the forward tapered shape, neither the thin-film layer nor the second electrode suffered from thinning and stepped cuts at the border portions of the insulation layer, and they were smoothly deposited. Thus, no degradation in the brightness was observed inside the luminescent region, and stable light emission was achieved. As the durability test, the device was held at 85° C. for 250 hours, and the luminescent characteristics were then evaluated. The luminescent region did not diminish compared to the initial stage, and good luminescence was obtained.

Example 14

An ITO electrode (pixels) of a predetermined pattern was formed on a planarizing film of a substrate, i.e., a TFT substrate, comprising switching elements in such a manner that the ITO electrode was in contact with the source/drain electrodes on the substrate.

Using this substrate, an insulation layer, a hole injection or transport material, an electroluminescent material, and a second electrode were formed on the substrate, and the resulting substrate was sealed as in Example 13.

When this device was driven in an active matrix mode, good display characteristics were obtained. Because the edge portions of the first electrode were covered with the insulation layer, no short-circuiting due to the field concentration was observed. Moreover, because the cross-section had the forward tapered shape, neither the thin-film layer nor the second electrode suffered from thinning and stepped cuts at the border portions of the insulation layer, and they were smoothly deposited. Thus, no degradation in the brightness was observed inside the luminescent region, and stable light emission was achieved. As the durability test, the device was held at 85° C. for 250 hours, and the luminescent characteristics were then evaluated. The luminescent region did not diminish compared to the initial period, and good luminescence was obtained.

Example 15

In a dry nitrogen gas stream, 11.41 g (0.057 mol) of 4,4'-diaminodiphenyl ether, 1.24 g (0.005 mol) of 1,3-bis(3-aminopropyl)tetramethyldisiloxane, and 8.18 g (0.075 mol) of 3-aminophenol (Tokyo Kasei Kogyo Co., Ltd.) as an endcap agent were dissolved in 80 g of NMP. Bis(3,4-dicarboxyphenyl)ether dianhydride (31.02 g, 0.10 mol) and 20 g of NMP were added thereto, and the mixture was allowed to react at 20° C. for 1 hour and then at 50° C. for 4 hours. Thereafter, 15.19 g (0.127 mol) of N,N-dimethylformamide dimethyl acetal was diluted with 4 g of NMP, and the resulting dilution was added dropwise over the period of 10 minutes. After the dropwise addition, the mixture was agitated at 50° C. for 3 hours. After the completion of agitation, the solution was poured into 2 l of water, and deposits of polymer solid were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were not detected at around 1780 cm$^{-1}$ and 1377 cm$^{-1}$. Subsequently, 8.5 g of this polymer solid was mixed with 1.5 g of the polymer solid obtained in Example 1, and the rate of imide conversion of the polymer solid mixture thus obtained was inspected.

Subsequently, 10 g of the polymer solid mixture, 0.5 g of a photopolymerization initiator, i.e., bis(α-isonitrosopropiophenone oxime)isophthal, 1 g of a thermally crosslinkable compound Nikalac MX-270 (trade name, Sanwa Chemical Co., Ltd.), 2 g of Tris P-Pa, and 5 g of trimethylolpropane diacrylate (a compound having a polymerizable functional group comprising unsaturated double bonds) were dissolved in 12 g of ethyl lactate to prepare a varnish J, which is a negative-working photosensitive polyimide composition. With the use of this varnish, a photosensitive polyimide film was formed on a silicon wafer as described above, exposed, post-exposure baked, developed in an alkaline developer, and then heat treated at 170° C. for 60 minutes. The alkaline developability of the varnish, the film retentivity, the film retentivity after shrinkage, the crack resistance, and stress resistance were evaluated.

Example 16

In a dry nitrogen gas stream, 30.03 g (0.082 mol) of 2,2-bis(3-amino-4-hydroxyphenyl)hexafluoropropane (BAHF), 1.24 g (0.005 mol) of 1,3-bis(3-aminopropyl)tetramethyldisiloxane, and 2.73 g (0.025 mol) of 3-aminophenol (Tokyo Kasei Kogyo Co., Ltd.) as an endcap agent were dissolved in 100 g of NMP. To this solution, 31.02 g (0.10 mol) of bis(3,4-dicarboxyphenyl)ether dianhydride and 30 g of NMP were added, and the mixture was allowed to react at 20° C. for 1 hour and then at 50° C. for 4 hours. Thereafter, 15.19 g (0.127 mol) of N,N-dimethylformamide dimethyl acetal was diluted with 4 g of NMP, and the resulting dilution was added dropwise over the period of 10 minutes. After the dropwise addition, the mixture was agitated at 50° C. for 3 hours. After the completion of agitation, the solution was poured into 2 l of water, and deposits of polymer solid were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were not detected at around 1780 cm$^{-1}$ and 1377 cm$^{-1}$. Subsequently, 5 g of this polymer solid was mixed with 5 g of the polymer solid obtained in Example 5, and the rate of imide conversion of the polymer solid mixture thus obtained was inspected.

Subsequently, 10 g of the polymer solid mixture, 0.4 g of a photopolymerization initiator, i.e., 1,2-octanedione,1-[4-(phenylthio)phenyl]-,2-(o-benzoyl oxime), 1.5 g of a thermally crosslinkable compound Nikalac MW-100 LM (trade name, Sanwa Chemical Co., Ltd.), 0.3 g of an A-DMA colorant (trade name, Hodogaya Chemical Co., Ltd.), and 10 g of trimethylolpropane triacrylate (a compound having a polymerizable functional group comprising unsaturated double bonds) were dissolved in 10 g of diacetone alcohol to prepare a varnish K, which is a negative-working photosensitive polyimide composition. With the use of this varnish, a photosensitive polyimide film was formed on a silicon wafer as described above, exposed, post-exposure baked, developed in an alkaline developer, and then heat treated at 180° C. for 60 minutes. The alkaline developability of the varnish, the film retentivity, the film retentivity after shrinkage, the crack resistance, and stress resistance were evaluated.

Example 17

In a dry nitrogen gas stream, 30.03 g (0.082 mol) of 2,2-bis(3-amino-4-hydroxyphenyl)hexafluoropropane (BAHF), 1.24 g (0.005 mol) of 1,3-bis(3-aminopropyl)tetramethyldisiloxane, and 2.73 g (0.025 mol) of 3-aminophenol (Tokyo Kasei Kogyo Co., Ltd.) as an endcap agent were dissolved in 100 g of NMP. To this solution, 31.02 g (0.10 mol) of bis(3,4-dicarboxyphenyl)ether dianhydride and 30 g of NMP were added, and the mixture was allowed to react at 20° C. for 1 hour and then at 50° C. for 4 hours. Thereafter, 15.19 g (0.127 mol) of N,N-dimethylformamide dimethyl acetal was diluted with 4 g of NMP, and the resulting dilution was added dropwise over the period of 10 minutes. After the dropwise addition, the mixture was agitated at 80° C. for 7 hours. After the completion of agitation, the solution was poured into 2 l of water, and deposits of polymer solid were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were not detected at around 1780 cm$^{-1}$ and 1377 cm$^{-1}$. Subsequently, 7 g of this polymer solid was mixed with 3 g of the polymer solid obtained in Example 5, and the rate of imide conversion of the polymer solid mixture thus obtained was inspected.

Subsequently, a varnish L, which is a negative-working photosensitive polyimide composition, was prepared in the same manner as in Example 16, except for the use of 10 g of the polymer solid mixture. With the use of this varnish, a photosensitive polyimide film was formed on a silicon wafer as described above, exposed, post-exposure baked, developed in an alkaline developer, and then heat treated at 180° C. for 60 minutes. The alkaline developability of the varnish, the film retentivity, the film retentivity after shrinkage, the crack resistance, and stress resistance were evaluated.

Comparative Example 1

In a dry nitrogen gas stream, 11.41 g (0.057 mol) of 4,4'-diaminodiphenyl ether, 1.24 g (0.005 mol) of 1,3-bis(3-aminopropyl)tetramethyldisiloxane, and 8.18 g (0.075 mol) of 3-aminophenol (Tokyo Kasei Kogyo Co., Ltd.) as an endcap agent were dissolved in 80 g of NMP. To this solution, 31.02 g (0.10 mol) of bis(3,4-dicarboxyphenyl)ether dianhydride and 20 g of NMP were added, and the mixture was allowed to react at 20° C. for 1 hour and then at 50° C. for 4 hours. Thereafter, 15.19 g (0.127 mol) of N,N-dimethylformamide dimethyl acetal was diluted with 4 g of NMP, and the resulting dilution was added dropwise over the period of 10 minutes. After the dropwise addition, the mixture was agitated at 50° C. for 3 hours. After the completion of agitation, the solution was poured into 2 l of water, and deposits of polymer solid were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were not detected at around 1780 cm$^{-1}$ and 1377 cm$^{-1}$. A polyimide precursor polymer solid (10 g) thus obtained, 0.5 g of a photopolymerization initiator, i.e., bis(α-isonitrosopropiophenone oxime)isophthal, 1 g of a thermally crosslinkable compound Nikalac MX-270 (trade name, Sanwa Chemical Co., Ltd.), 2 g of Tris P-Pa, and 5 g of trimethylolpropane diacrylate (a compound having a polymerizable functional group comprising unsaturated double bonds) were dissolved in 12 g of ethyl lactate to prepare a varnish A1, which is a negative-working photosensitive polyimide precursor composition. With the use of this varnish, a photosensitive polyimide precursor film was formed on a silicon wafer as described above, exposed, post-exposure baked, developed in an alkaline developer, and then heat treated at 170° C. for 60 minutes. The alkaline developability of the varnish, the film retentivity, the film retentivity after shrinkage, the crack resistance, and stress resistance were evaluated.

Comparative Example 2

In a dry nitrogen gas stream, 46.55 g (0.077 mol) of the hydroxyl-group-containing diamine compound (III), which was obtained in Synthetic Example 3, was dissolved in 250 g of NMP. The hydroxyl-group-containing acid anhydride (b) (71.45 g, 0.1 mol), which was obtained in Synthetic Example 2, and 7.38 g (0.045 mol) of 3-hydroxyphthalic anhydride (Tokyo Kasei Kogyo Co., Ltd.) as an endcap agent were added thereto, and the mixture was allowed to react at 60° C. for 2 hours. Thereafter, 15.19 g (0.127 mol) of N,N-dimethylformamide dimethyl acetal was diluted with 4 g of NMP, and the resulting dilution was added dropwise over the period of 10 minutes. After the dropwise addition, the mixture was agitated at 50° C. for 3 hours. After the completion of agitation, the solution was poured into 2 l of water, and deposits of polymer solid were collected by filtration. The collected deposits were washed three times with water and dried in a vacuum dryer at 80° C. for 20 hours. The resulting polymer solid was subjected to infrared absorption spectrum measurement, and the absorption peaks of the polyimide imide structure were not detected at around 1780 cm$^{-1}$ and 1377 cm$^{-1}$. A polyimide precursor polymer solid (10 g) thus obtained, 2.5 g of a photopolymerization initiator, i.e., 2-benzyl-2-dimethylamino-1-(4-morpholinophenyl)-butanone-1, 8 g of pentaerythritol triacrylate (a compound having a polymerizable functional group comprising unsaturated double bonds), 5 g of a thermally crosslinkable compound DML-PC (trade name, Honshu Chemical Industry Co., Ltd.), and 1 g of vinyltrimethoxysilane were dissolved in 10 g of 3-methyl-3-methoxybutanol to prepare a varnish B1, which is a photosensitive polyimide precursor composition. With the use of this varnish, a photosensitive polyimide precursor film was formed on a silicon wafer as described above, exposed, post-exposure baked, developed in an alkaline developer, and then heat treated at 180° C. for 60 minutes. The alkaline developability of the varnish, the film retentivity, the film retentivity after shrinkage, the crack resistance, and stress resistance were evaluated.

Comparative Example 3

With the use of the varnish BI, which is a negative-working photosensitive polyimide precursor composition obtained in Comparative Example 2, a photosensitive polyimide precursor film was formed on a silicon wafer as described above, exposed, post-exposure baked, developed in an alkaline developer, and then heat treated at 350° C. for 60 minutes. The alkaline developability of the varnish, the film retentivity, the film retentivity after shrinkage, the crack resistance, and stress resistance were evaluated.

Comparative Example 4

A varnish C1, which is a negative-working photosensitive polyimide composition, was prepared in the same manner as in Example 1, except that 3-aminophenol was not used as an endcap agent. With the use of the resulting varnish, a photosensitive polyimide film was formed on a silicon wafer as described above, exposed, post-exposure baked, developed in an alkaline developer, and then heat treated at 170° C. for 60 minutes. The alkaline developability of the varnish, the film retentivity, the film retentivity after shrinkage, the crack resistance, and stress resistance were evaluated.

Comparative Example 5

A varnish D1, which is a negative-working photosensitive polyimide composition, was prepared in the same manner as in Example 2, except that the amount of the hydroxyl-group-containing diamine compound (III) obtained in Synthetic Example 3 to be added was altered to 60.45 g (0.1 mol) and the activated ester compound (I) was not used as an endcap agent. With the use of the resulting varnish, a photosensitive polyimide film was formed on a silicon wafer as described above, exposed, post-exposure baked, developed in an alkaline developer, and then heat treated at 200° C. for 60 minutes. The alkaline developability of the varnish, the film retentivity, the film retentivity after shrinkage, the crack resistance, and stress resistance were evaluated.

Comparative Example 6

A simple-matrix color organic electroluminescent device was prepared in the same manner as in Example 9, except for the use of the varnish A1 prepared in Comparative Example 1. When the resulting device was driven line-sequentially, no degradation in the brightness was observed. However, a significant level of uneven luminescence was observed in the edge portion of the luminescent display unit, and good display characteristics were not obtained.

Comparative Example 7

An onium salt (0.5 g, DPI-TF: trade name, Toyo Gosei Co., Ltd.) was dissolved in the polyimide varnish C obtained in Example 3 to prepare a varnish E1. A simple-matrix color organic electroluminescent device was prepared in the same manner as in Example 9, except that the varnish E1 was used and heat treatment was carried out at 180° C. for 30 minutes. When the resulting device was driven line-sequentially, degradation in the brightness was observed, and a significant level of uneven luminescence was observed in the edge portion of the luminescent display unit. Good display characteristics were not obtained.

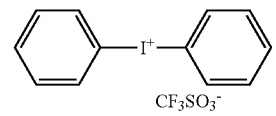

DPI-TF

Compositions of Examples 1 to 8 and 15 to 17 are shown in Table 1, compositions of Comparative Examples 1 to 5 are shown in Table 2, and the results of evaluation are shown in Table 3.

TABLE 1

| | Resin composition | Polymer (a) | | Compound (b) having a polymerizable group | Photopolymerization initiator (c) |
| --- | --- | --- | --- | --- | --- |
| | | Polymer type | Endcap agent | | |
| Ex. 1 | A | 100% by weight of polyimide | 3-Aminophenol | Trimethylolpropane diacrylate | Bis(α-isonitrosopropiophenone oxime)isophthal |
| Ex. 2 | B | 100% by weight of polyimide | Activated ester (I) | Pentaerythritol triacrylate | 2-Benzyl-2-dimethylamino-1-(4-morpholinophenyl)-butanone-1 |
| Ex. 3 | C | 100% by weight of polyimide | 3-Hydroxyphthalic anhydride | Pentaerythritol triacrylate | 2-Benzyl-2-dimethylamino-1-(4-morpholinophenyl)-butanone-1 |
| Ex. 4 | D | 100% by weight of polyimide | 4-Aminothiophenol | Dimethylol-tricyclodecane diacrylate | N-Phenylglycine Bis(α-isonitrosopropiophenone oxime)isophthal |
| Ex. 5 | E | 100% by weight of polyimide | 3-Aminophenol | Trimethylolpropane triacrylate | 1,2-Octanedione, 1-[4-(phenylthio)phenyl]-, 2-(o-benzoyl oxime) |
| Ex. 6 | F | 100% by weight of polyimide | 3-Hydroxyphthalic anhydride | Dimethylol-tricyclodecane diacrylate Trimethylolpropane diacrylate | 2-Benzyl-2-dimethylamino-1-(4-morpholinophenyl)-butanone-1 |

TABLE 1-continued

| | | Polymer (a) | | Compound (b) having | |
|---|---|---|---|---|---|
| | | Polymer type | Endcap agent | a polymerizable group | Photopolymerization initiator (c) |
| Ex. 7 | G | 100% by weight of polyimide | 4-Aminothiophenol | N-(3-Diethylaminopropyl)-methacrylamide<br>Dimethylol-tricyclodecane diacrylate | 1-Phenyl-1,2-butanedione-2-(o-methoxycarbonyl)oxime |
| Ex. 8 | H | 100% by weight of polyimide | 3-Aminophenol | Dimethylol-tricyclodecane diacrylate<br>N-vinyl caprolactam | 1-Phenyl-1,2-butanedione-2-(o-methoxycarbonyl)oxime |
| Ex. 15 | J | 15% by weight of polyimide and 85% by weight of polyimide precursor | 3-Aminophenol | Trimethylolpropane diacrylate | Bis(α-isonitrosopropiophenone oxime)isophthal |
| Ex. 16 | K | 50% by weight of polyimide and 50% by weight of polyimide precursor | 3-Aminophenol | Trimethylolpropane triacrylate | 1,2-Octanedione, 1-[4-(phenylthio)phenyl]-, 2-(o-benzoyl oxime) |
| Ex. 17 | L | 30% by weight of polyimide and 70% by weight of polyimide precursor | 3-Aminophenol | Trimethylolpropane triacrylate | 1,2-Octanedione, 1-[4-(phenyl-thio)phenyl]-, 2-(o-benzoyl oxime) |

| | Resin composition | Thermally crosslinkable compound (d) | Colorant (e) | Compound having a phenolic hydroxyl group | Solvent |
|---|---|---|---|---|---|
| Ex. 1 | A | Nikalac MX-270 | None | TrisP-PA | Ethyl lactate |
| Ex. 2 | B | None | None | None | γ-Butyrolactone |
| Ex. 3 | C | DML-PC | None | None | 3-Methyl-3-methoxybutanol |
| Ex. 4 | D | TML-HQ | None | None | Propylene glycol monomethyl ether |
| Ex. 5 | E | Nikalac MW-100LM | A-DMA | None | Diacetone alcohol |
| Ex. 6 | F | None | Oil Blue 2N CVL | None | Ethyl lactate |
| Ex. 7 | G | DMOM-PTBP | None | BIR-PC | γ-Butyrolactone Cyclopentanone |
| Ex. 8 | H | B-a type benzoxazine | None | BIR-PC | Diacetone alcohol |
| Ex. 15 | J | Nikalac MX-270 | None | TrisP-PA | Ethyl lactate |
| Ex. 16 | K | Nikalac MW-100LM | A-DMA | None | Diacetone alcohol |
| Ex. 17 | L | Nikalac MW-100LM | A-DMA | None | Diacetone alcohol |

TABLE 2

| | Resin composition | Polymer (a) | | Compound (b) having | |
|---|---|---|---|---|---|
| | | Polymer type | Endcap agent | a polymerizable group | Photopolymerization initiator (c) |
| Comp. Ex. 1 | A1 | 100% by weight of polyimide precursor | 3-Aminophenol | Trimethylolpropane diacrylate | Bis(α-isonitrosopropiophenone oxime)isophthal |
| Comp. Ex. 2 | B1 | 100% by weight of polyimide precursor | 3-Hydroxyphthalic anhydride | Pentaerythritol triacrylate | 2-Benzyl-2-dimethylamino-1-(4-morpholinophenyl)-butanone-1 |
| Comp. Ex. 3 | B1 | 100% by weight of polyimide precursor | 3-Hydroxyphthalic anhydride | Pentaerythritol triacrylate | 2-Benzyl-2-dimethylamino-1-(4-morpholinophenyl)-butanone-1 |
| Comp. Ex. 4 | C1 | 100% by weight of polyimide | None | Trimethylolpropane diacrylate | Bis(α-isonitrosopropiophenone oxime)isophthal |
| Comp. Ex. 5 | D1 | 100% by weight of polyimide | None | Pentaerythritol triacrylate | 2-Benzyl-2-dimethylamino-1-(4-morpholinophenyl)-butanone-1 |

| | Resin composition | Thermally crosslinkable compound (d) | Colorant (e) | Compound having a phenolic hydroxyl group | Solvent |
|---|---|---|---|---|---|
| Comp. Ex. 1 | A1 | Nikalac MX-270 | None | TrisP-PA | Ethyl lactate |
| Comp. Ex. 2 | B1 | DML-PC | None | None | 3-Methyl-3-methoxybutanol |
| Comp. Ex. 3 | B1 | DML-PC | None | None | 3-Methyl-3-methoxybutanol |
| Comp. Ex. 4 | C1 | Nikalac MX-270 | None | TrisP-PA | Ethyl lactate |
| Comp. Ex. 5 | D1 | None | None | None | γ-Butyrolactone |

TABLE 3

| Resin composition | | Polymer (a) | | | |
|---|---|---|---|---|---|
| | | Polymer type | Endcap agent | Rate of imide conversion (%) | Heat treatment conditions |
| Ex. 1 | A | Polyimide | 3-Aminophenol | 100 | 170° C. × 60 min. |
| Ex. 2 | B | Polyimide | Activated ester (a) | 100 | 200° C. × 60 min. |
| Ex. 3 | C | Polyimide | 3-Hydroxyphthalic anhydride | 100 | 180° C. × 60 min. |
| Ex. 4 | D | Polyimide | 4-Aminothiophenol | 100 | 150° C. × 60 min. |
| Ex. 5 | E | Polyimide | 3-Aminophenol | 100 | 180° C. × 60 min. |
| Ex. 6 | F | Polyimide | 3-Hydroxyphthalic anhydride | 100 | 200° C. × 60 min. |
| Ex. 7 | G | Polyimide | 4-Aminothiophenol | 100 | 210° C. × 30 min. |
| Ex. 8 | H | Polyimide | 3-Aminophenol | 100 | 180° C. × 30 min. |
| Ex. 15 | J | Polyimide precursor/polyimide | 3-Aminophenol | 20 | 170° C. × 60 min. |
| Ex. 16 | K | Polyimide precursor/polyimide | 3-Aminophenol | 55 | 180° C. × 60 min. |
| Ex. 17 | L | Polyimide precursor/polyimide | 3-Aminophenol | 35 | 180° C. × 60 min. |
| Comp. Ex. 1 | A1 | Polyimide precursor | 3-Aminophenol | 0 | 170° C. × 60 min. |
| Comp. Ex. 2 | B1 | Polyimide precursor | 3-Hydroxyphthalic anhydride | 0 | 180° C. × 60 min. |
| Comp. Ex. 3 | B1 | Polyimide precursor | 3-Hydroxyphthalic anhydride | 0 | 350° C. × 60 min. |
| Comp. Ex. 4 | C1 | Polyimide | None | 100 | 170° C. × 60 min. |
| Comp. Ex. 5 | D1 | Polyimide | None | 100 | 200° C. × 60 min. |

| | Resin composition | Developability in alkaline solution | Film retentivity (%) | Film retentivity after shrinkage (%) | Crack resistance | Stress resistance |
|---|---|---|---|---|---|---|
| Ex. 1 | A | Soluble in alkaline developer | 90 | 92 | Not cracked | Not wrinkled |
| Ex. 2 | B | Soluble in alkaline developer | 88 | 88 | Not cracked | Not wrinkled |
| Ex. 3 | C | Soluble in alkaline developer | 90 | 91 | Not cracked | Not wrinkled |
| Ex. 4 | D | Soluble in alkaline developer | 92 | 93 | Not cracked | Not wrinkled |
| Ex. 5 | E | Soluble in alkaline developer | 91 | 93 | Not cracked | Not wrinkled |
| Ex. 6 | F | Soluble in alkaline developer | 92 | 87 | Not cracked | Not wrinkled |
| Ex. 7 | G | Soluble in alkaline developer | 91 | 90 | Not cracked | Not wrinkled |
| Ex. 8 | H | Soluble in alkaline developer | 92 | 90 | Not cracked | Not wrinkled |
| Ex. 15 | J | Soluble in alkaline developer | 88 | 83 | Not cracked | Not wrinkled |
| Ex. 16 | K | Soluble in alkaline developer | 90 | 87 | Not cracked | Not wrinkled |
| Ex. 17 | L | Soluble in alkaline developer | 88 | 85 | Not cracked | Not wrinkled |
| Comp. Ex. 1 | A1 | Soluble in alkaline developer | 85 | 78 | Cracked | Wrinkled |
| Comp. Ex. 2 | B1 | Soluble in alkaline developer | 83 | 78 | Cracked | Wrinkled |
| Comp. Ex. 3 | B1 | Soluble in alkaline developer | 84 | 70 | Not cracked | Wrinkled |
| Comp. Ex. 4 | C1 | Insoluble in alkaline developer | 100 | 91 | — | — |
| Comp. Ex. 5 | D1 | Insoluble in alkaline developer | 100 | 86 | — | — |

All publications, patents, and patent applications cited herein are incorporated herein by reference in their entirety.

INDUSTRIAL APPLICABILITY

The present invention relates to a heat resistant resin composition that is suitable for a surface protective film of a semiconductor device, an interlayer insulation film of a semiconductor device, an insulation layer of an organic electroluminescent element, and an insulation film for protecting wirings of a circuit substrate.

What is claimed is:
1. A photosensitive resin composition comprising: (a) a polyimide-containing component comprising at least one group selected from the group consisting of a carboxyl group, a phenolic hydroxyl group, a sulfonic acid group, and a thiol group at the terminus of the polymer main chain; (b) a com- pound having a polymerizable functional group comprising unsaturated double and/or triple bonds; (c) a photopolymerization initiator; and (d) a thermally crosslinkable compound, wherein the thermally crosslinkable compound is a compound comprising an organic group represented by formula (5):

  (5)

wherein $R^6$ represents a hydrogen atom, an alkyl group having 1 to 20 carbon atoms, a alicyclic group having 4 to 20 carbon atoms, or an $R^7CO$ group; and $R^7$ represents an alkyl group having 1 to 20 carbon atoms, or a benzoxazine compound.

2. The photosensitive resin composition according to claim 1, further comprising a colorant.

3. The photosensitive resin composition according to claim 1, wherein the polyimide-containing component comprises at least one member comprising a structural unit represented by formula (1), formula (2), formula (3) or formula (4), and the polyimide content is 10% by weight or more based on the amount of the entire polymer in the composition:

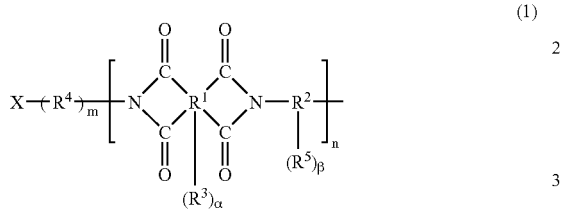  (1)

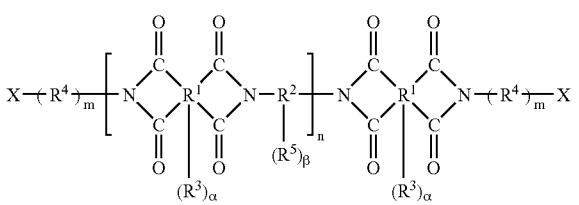  (2)

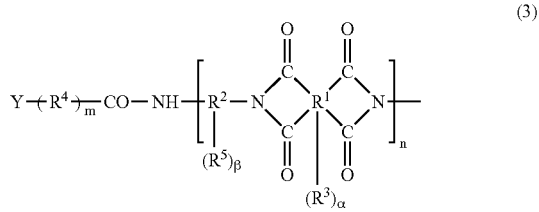  (3)

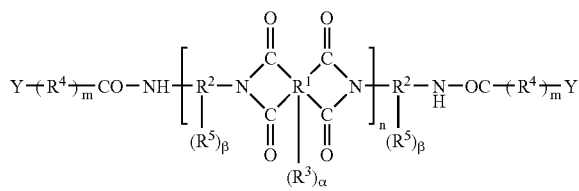  (4)

wherein $R^1$ represents a 4- to 14-valent organic group; $R^2$ represents a 2- to 12-valent organic group; $R^3$ and $R^5$ each represent a hydrogen atom or an organic group having at least one member selected from the group consisting of a phenolic hydroxyl group, a sulfonic acid group, a thiol group, and organic groups having 1 to 20 carbon atoms, which may be the same or different; $R^4$ represents a 2-valent organic group; X and Y each represent a 2-valent to 8-valent organic group having at least one member selected from the group consisting of a carboxyl group, a phenolic hydroxyl group, a sulfonic acid group, and a thiol group; n is a number between 3 and 200; and m, α, and β are each an integer between 0 and 10.

4. The photosensitive resin composition according to claim 3, wherein m in formulae (1) to (4) is 0.

5. A process for producing a heat resistant resin comprising applying the photosensitive resin composition according to claim 1 to a support substrate to form a coating; and developing the coating using a developer to produce the heat resistant resin.

6. An electronic component comprising the heat resistant resin obtained by the method according to claim 5 as a surface protecting film or an interlayer insulation film.

7. A method for producing an organic electroluminescent device comprising forming a photosensitive resin film by applying the photosensitive resin composition according to claim 1 to a substrate having a first electrode formed thereon; forming an insulation layer by developing the photosensitive resin film; forming a luminescent layer, and forming a second electrode.

8. A display unit comprising the heat resistant resin film obtained by the method according to claim 5.

* * * * *